(12) United States Patent
Yen et al.

(10) Patent No.: US 10,020,368 B2
(45) Date of Patent: Jul. 10, 2018

(54) SILICON CARBIDE SEMICONDUCTOR ELEMENT AND MANUFACTURING METHOD THEREOF

(71) Applicant: Hestia Power Inc., Hsinchu (TW)

(72) Inventors: Cheng-Tyng Yen, Hsinchu (TW); Chien-Chung Hung, Hsinchu (TW); Hsiang-Ting Hung, Hsinchu (TW); Yao-Feng Huang, Hsinchu (TW); Chwan-Ying Lee, Hsinchu (TW)

(73) Assignee: HESTIA POWER INC., Hsinchu (TW)

( * ) Notice: Subject to any disclaimer, the term of this patent is extended or adjusted under 35 U.S.C. 154(b) by 0 days.

(21) Appl. No.: 15/364,972

(22) Filed: Nov. 30, 2016

(65) Prior Publication Data

US 2017/0207305 A1    Jul. 20, 2017

(30) Foreign Application Priority Data

Jan. 15, 2016  (TW) .............................. 105101176 A

(51) Int. Cl.
*H01L 29/16* (2006.01)
*H01L 29/10* (2006.01)
(Continued)

(52) U.S. Cl.
CPC ........ *H01L 29/1608* (2013.01); *H01L 21/047* (2013.01); *H01L 29/0865* (2013.01);
(Continued)

(58) Field of Classification Search
CPC ............. H01L 29/1608; H01L 29/7816; H01L 29/7393; H01L 29/0865
(Continued)

(56) References Cited

U.S. PATENT DOCUMENTS 8,994,118 B2    3/2015  Matocha et al.
2013/0234159 A1*  9/2013  Tsuchiya ................ H01L 29/78
257/77
(Continued)

OTHER PUBLICATIONS

S. Salemi et al."The effect of defects and their passivation on the density of states of the 4H-silicon-carbide/silicon-dioxide interface";, J. Appl. Phys. 113, 053703, Feb. 1, 2013; pp: 053703-1 to 053703-6.

(Continued)

*Primary Examiner* — Moazzam Hossain
*Assistant Examiner* — Warren H Kilpatrick
(74) *Attorney, Agent, or Firm* — Muncy, Geissler, Olds & Lowe, P.C.

(57) ABSTRACT

A silicon carbide (SiC) semiconductor element includes a semiconductor layer, a dielectric layer on a surface of the semiconductor layer, a gate electrode layer on the dielectric layer, a first doped region, a second doped region, a shallow doped region and a third doped region. The semiconductor layer is of a first conductivity type. The first doped region is of a second conductivity type and includes an upper doping boundary spaced from the surface by a first depth. The shallow doped region is of the second conductivity type, and extends from the surface to a shallow doped depth. The second doped region is adjacent to the shallow doped region and is at least partially in the first doped region. The third doped region is of the second conductivity type and at least partially overlaps the first doped region.

15 Claims, 22 Drawing Sheets

(51) Int. Cl.
*H01L 29/78* (2006.01)
*H01L 29/08* (2006.01)
*H01L 29/739* (2006.01)
*H01L 29/04* (2006.01)
*H01L 29/417* (2006.01)
*H01L 21/04* (2006.01)
*H01L 29/66* (2006.01)

(52) U.S. Cl.
CPC .... *H01L 29/1095* (2013.01); *H01L 29/66068* (2013.01); *H01L 29/7393* (2013.01); *H01L 29/7396* (2013.01); *H01L 29/7802* (2013.01); *H01L 29/7816* (2013.01); *H01L 29/41766* (2013.01)

(58) Field of Classification Search
USPC .......................................................... 257/77
See application file for complete search history.

(56) References Cited

U.S. PATENT DOCUMENTS

2015/0249141 A1\* 9/2015 Yu ..................... H01L 29/66492
257/77
2016/0087044 A1\* 3/2016 Iijima ................. H01L 29/1095
257/77

OTHER PUBLICATIONS

D. Okamoto et al., "Investigation of Oxide Films Prepared by Direct Oxidation of C-face 4H-SiC in Nitric Oxide"; Materials Science Forum vols. 645-648, Apr. 29, 2010; pp. 515-518.
Y. K. Sharma et al., "Phosphorous passivation of the SiO2/4H—SiC interface";, Solid-State Electronics 68; Nov. 16, 2011; pp. 103-107.
John Rozen et al., "The Limits of Post Oxidation Annealing in NO"; Materials Science Forum vols. 645-648; Apr. 29, 2010; pp. 693-696.
Constantin Bulucea et al.; "Threshold Voltage Control in Buried-Channel MOSFETs"; Solid-State Electronics; vol. 41, No. 9, Feb. 2, 1997; pp. 1345-1354.
S. Harada et al; "Low on-resistance in inversion channel IEMOSFET formed on 4H-SiC C-face substrate"; Proceedings of the 18th International Symposium on Power Semiconductor Devices & IC's Jun. 4, 2006; Naples, Italy; pp. 1-4.
Shinsuke Harada et al; "4.3 mΩcm2 , 1100 V 4H-SiC Implantation and Epitaxial MOSFET"; Materials Science Forum; vols. 527-529; Oct. 15, 2006; pp. 1281-1284.
William E.Wagner et al; "Characterization of Silicon Carbide (SiC) Epitaxial Channel MOSFETs"; IEEE Transactions on Electron Devices, vol. 47, Nov. 2000; pp. 2214-2220.
Tsunenobu Kimoto; "Material science and device physics in SiC technology for high-voltage power devices"; Japanese Journal of Applied Physics 54, Mar. 23, 2015, pp. 040103-1 to 040103-28.
John Rozen et al; "Scaling Between Channel Mobility and Interface State Density in SiC MOSFETs"; IEEE Transactions on Electron Devices; vol. 58; No. 11; Sep. 26, 2011; 3808-3811.

\* cited by examiner

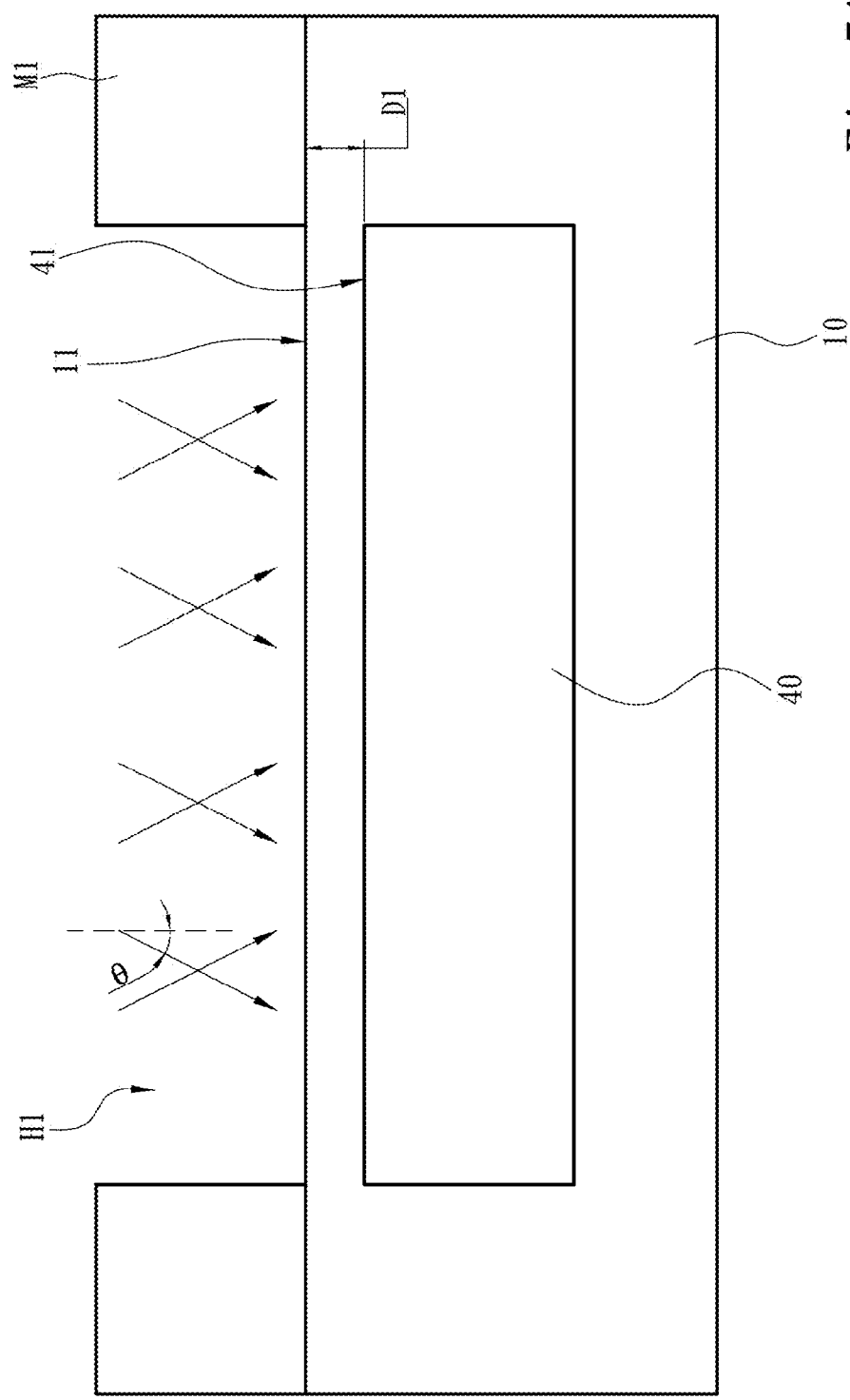

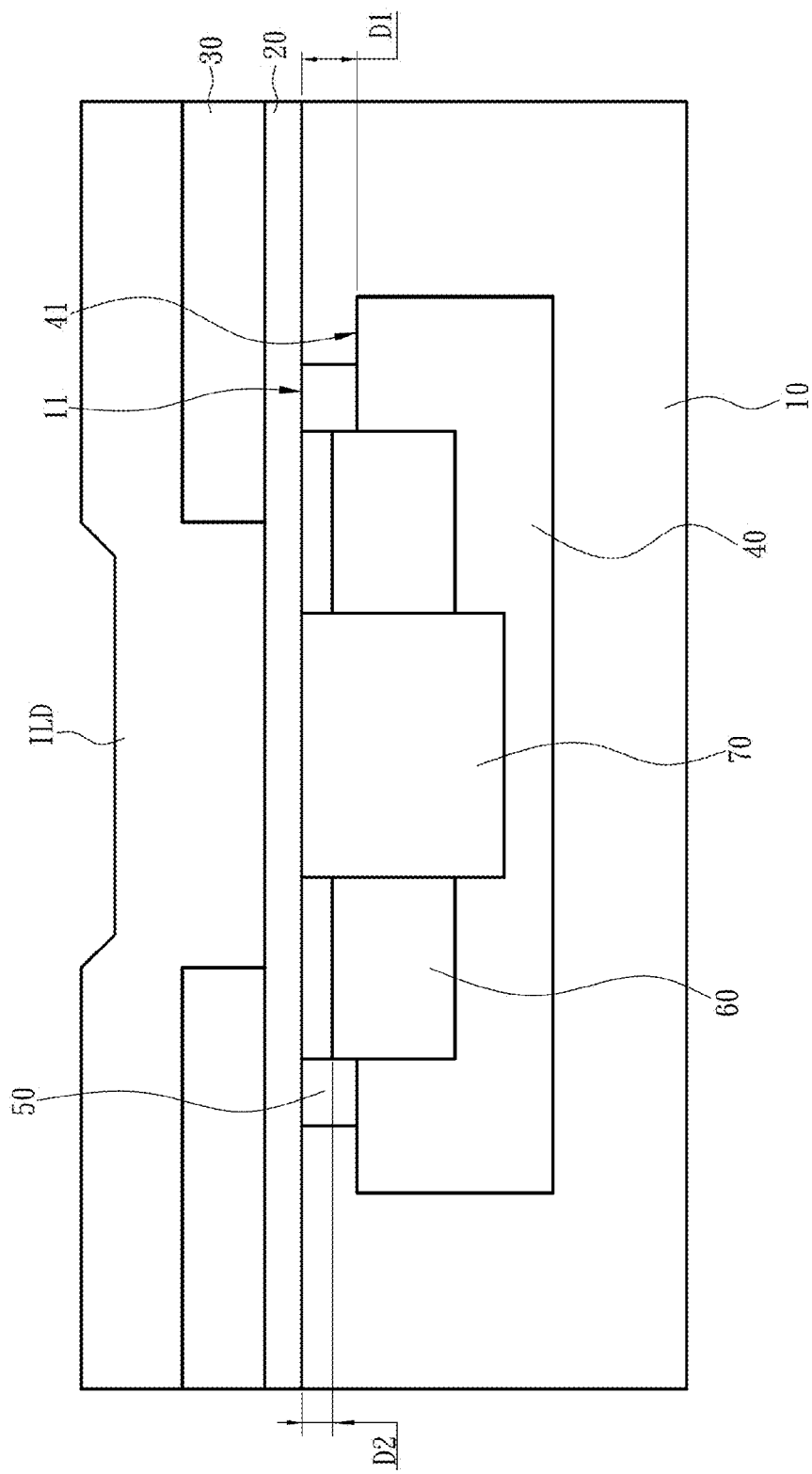

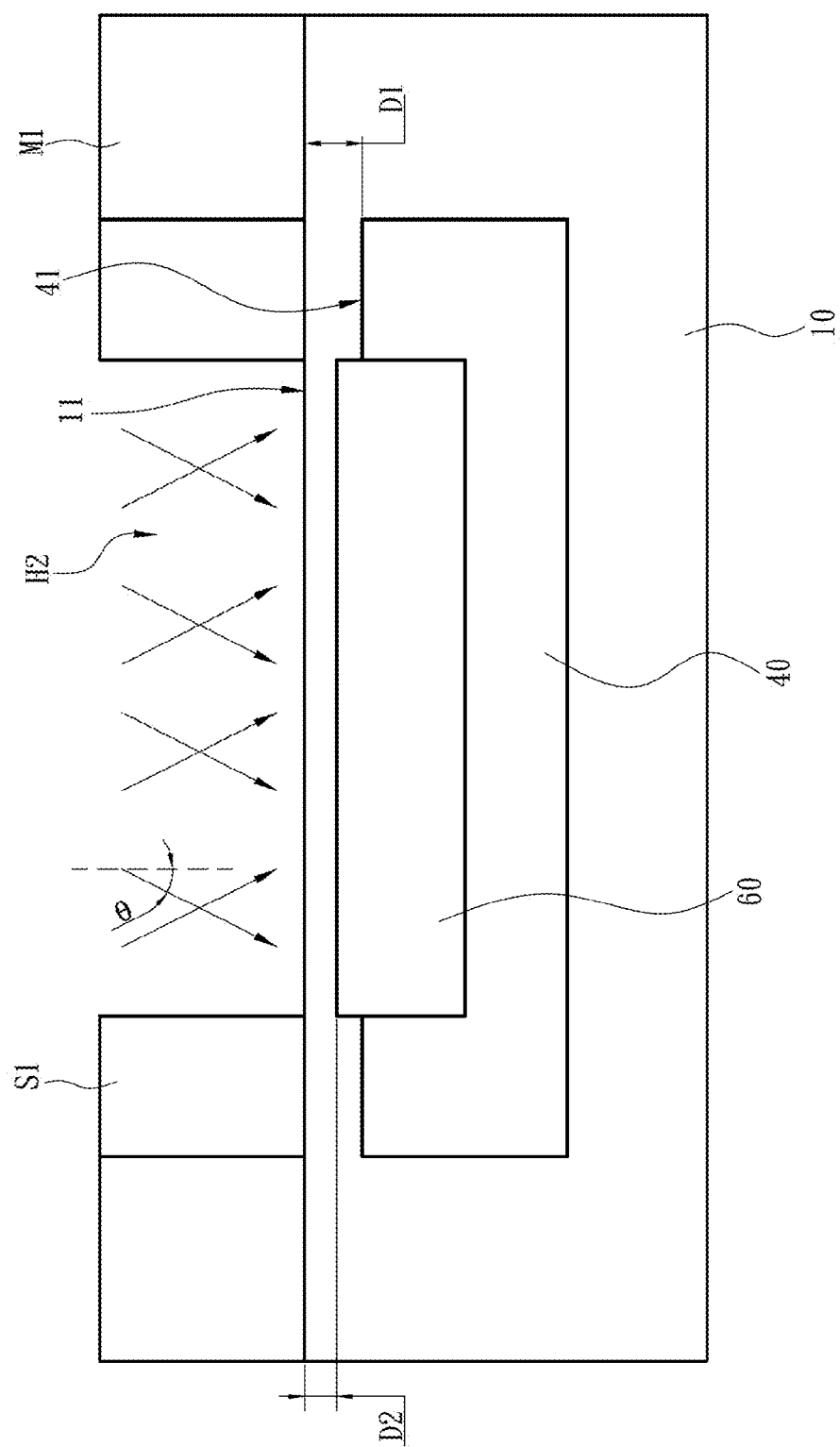

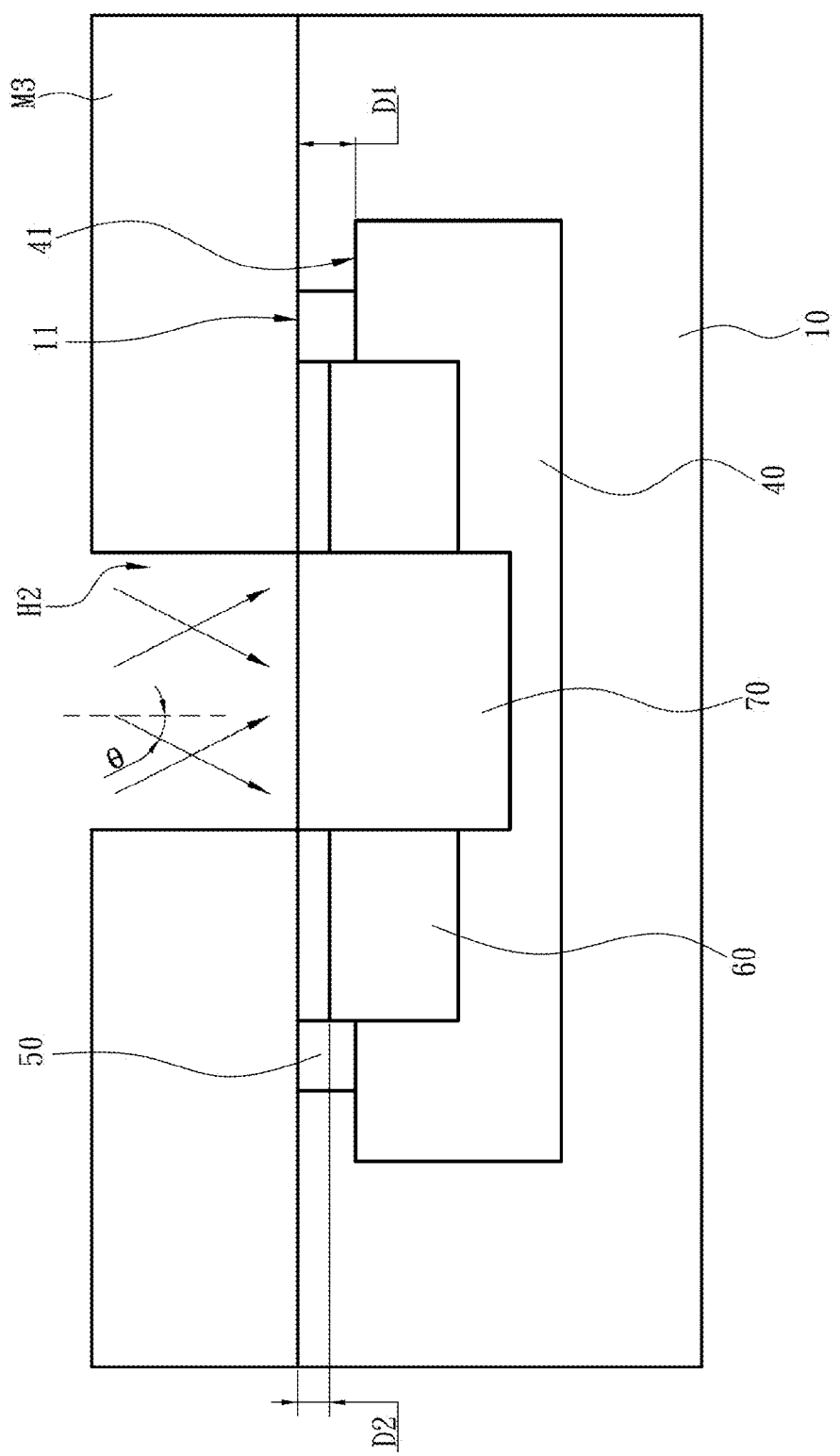

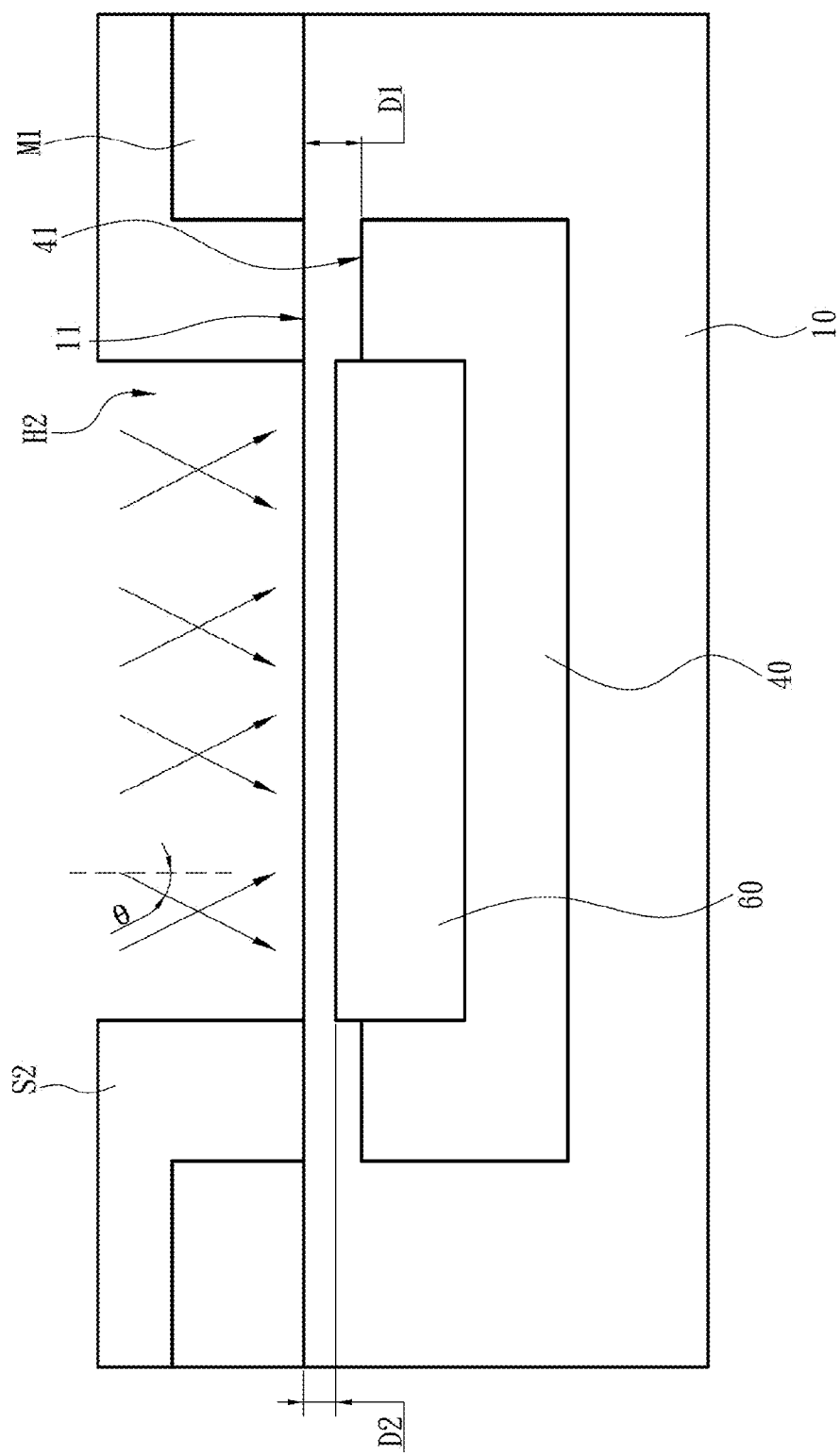

SILICON CARBIDE SEMICONDUCTOR ELEMENT AND MANUFACTURING METHOD THEREOF

FIELD OF THE INVENTION

The present invention relates to a semiconductor element, and particularly to a silicon carbide (SiC) semiconductor element.

BACKGROUND OF THE INVENTION

Semiconductor power devices, in terms of blocking voltage in design, should provide characteristics of minimum conduction resistance, lower reverse leakage current and faster switching speed to reduce conduction loss and switching loss during operation. Silicon carbide (SiC) has characteristics of a wide energy bandgap (for instance, energy bandgap of 4H—SiC is 3.26 eV, compared to 1.1 eV of silicon), a higher critical field of dielectric breakdown (2.2 MV/cm) and a higher thermal conduction coefficient (4.9 W/cm-K), hence is deemed an excellent material for making power switching devices. Silicon carbide is also the only compound semiconductor can form thermally grown oxides, hence is suitable for manufacturing MOS controlled switches such as MOSFET (metal oxide semiconductor field effect transistor) and IGBT (insulated gate bipolar transistor).

For example, the U.S. Pat. No. 8,994,118 B2 discloses a conventional SiC MOSFET. The above disclosure mainly includes a semiconductor substrate layer of a first conductivity type, a drift layer of the first conductivity type, a first well region of a second conductivity type, a second well region of the second conductivity type, a first source region of the first conductivity type, a second source region of the first conductivity type, a first gate dielectric layer, a gate electrode, an interlayer dielectric material, and a source ohmic contact. The drift layer is on the substrate layer. The first well region is in a central portion of the drift layer. The second well region is in the central portion of the drift layer and is spaced from the first well region. The first source region is in the first well region. The second source region is in the second well region. The first gate dielectric layer is on the drift layer and is in contact with the first source region and the second source region. The gate electrode is on the first gate dielectric layer, and includes a lower surface on the first gate dielectric layer, an upper surface opposite the lower surface and sidewalls. The interlayer dielectric material is on the upper surface and is adjacent the sidewalls of the gate electrode. The source ohmic contact is in the first source region and the second source region.

The oxidation rate of SiC depends on the conductivity types, doping concentrations as well as polytypes of SiC. In a conventional SiC MOSFET, as the source region is generally formed on a surface of a drift layer with a high concentration of n-type doping (with phosphorus as a dopant). While the gate oxide layer is grown, the high-concentration n-type doped region has a faster oxidation rate than that of a p-type well, hence resulting in an uneven thickness of the gate oxide layer. Further, during the process of forming high doping concentration source region, a part of lattices of SiC may be damaged due to collisions with implanted ions to transform into amorphous structures. These amorphous structures may become other polytypes when the lattices are restored in a subsequent activation annealing process. For example, assuming that the polytype of the original drift layer is 4H, the polytype of a part of the drift layer may become 3C after the annealing process. Thus a rough oxide/SiC interface will be formed after the growth of gate oxide because of different oxidation rates of 4H and 3C polytypes. As a result, a high electric field may be crowded around some localized points of gate oxide, and poses reliability concerns.

In addition, during the thermal oxidation of SiC, the unreacted carbon will remain at the interface and inside of oxide as defects in the form of silicon vacancies, carbon clusters and carbon interstitials, and create energy states in the band gap. These defect states will become acceptor-like traps or donor-like traps at the interface. In general, SiC MOSFET are n-channel MOSFETs. When inversion channel is formed on the p-well, the electrons will be captured by acceptor-like traps near the conduction band, and the density of electrons available for conducting electric current will be reduced. In the meantime the acceptor-like traps filled with electrons will become negatively charged, and cause significant Coulomb scattering of electrons. The reduced electron density and significant Coulomb scattering explain the very low channel mobility and high conduction resistance of SiC MOSFET. Approaches of improving channel mobility and conduction resistance include passivation of the interface traps by post-oxidation annealing with nitric oxide (NO), nitrous oxide ($N_2O$) or $POCl_3$. Non-patent references can be found as follows:

[1] S. Salemi, N. Goldsman, D. P. Eittsserry, A. Akturk, A. Lelis, J. Appl. Phys. 113, 053703, 2013;

[2] D. Okamoto, H. Yano, Y. Oshiro, T. Hatayama, Y. Uraoka and T. Fuyuki, Materials Science Forum Vols. 645-648, 2010 pp 515-518;

[3] Y K. Sharma, A. C. Ahyi, T. Issacs-Smith, X. Shen, S. T. Pantelides, X. Zhu, L. C. Feldman, J. Rozen, J. R. Williams, Solid-State Electronics 68 (2012) 103-107.

[4] John Rozen, Ayayi C. Ahyi, Xingguang Zhu, John R. Williams, and Leonard C. Feldman, IEEE Transactions on Electron Devices, Vol. 58, No. 11, November 2011, pp. 3808-3811.

[5] John Rozen, Xingguang Zhu, A. C. Ahyi, J. R. Williams and L. C. Feldman, Materials Science Forum Vols. 645-648 (2010) pp 693-696.

[6] Constantin Bulucea and Daniel Kerr, Solid-State Electronics Vol. 41, No. 9, pp. 1345-1354, 1997.

[7] S. Harada, M. Kato, M. Okamoto, T. Yatsuo, K. Fukuda, K. Arai, Proceedings of the 18th International Symposium on Power Semiconductor Devices & IC's Jun. 4-8, 2006 Naples, Italy.

[8] Shinsuke Harada, Makoto Kato, Mitsuo Okamoto, Tsutomu Yatsuo, Kenji Fukuda and Kazuo Arai, Materials Science Forum Vols. 527-529 (2006) pp 1281-1284.

[9] William E. Wagner, III and Marvin H. White, IEEE Transactions on Electron Devices, Vol. 47, No. 11, November 2000, Pp. 2214-2219.

[10] Tsunenobu Kimoto, Japanese Journal of Applied Physics 54, 040103 (2015).

However, the current approaches of reducing on-resistance usually face the trade-off of lowered MOSFET threshold voltage. A low threshold voltage increases the risk of falsely turn-on during operation of devices

SUMMARY OF THE INVENTION

The primary object of the present invention is to solve issues of degraded reliability caused by an uneven thickness of a gate oxide layer, as well as the risk of falsely turn-on caused by a lowered threshold voltage when trying to lower the on-resistance of silicon carbide (SiC) semiconductor devices.

To achieve the above object, the present invention provides a SiC semiconductor element. The SiC semiconductor element of the present invention includes: a semiconductor layer of a first conductivity type, the semiconductor layer being made of SiC and including a surface; a dielectric layer on the surface of the semiconductor layer; a gate electrode layer on the dielectric layer; a first doped region of a second conductivity type opposite the first conductivity type, the first doped region being in the semiconductor layer and including an upper doping boundary spaced from the surface by a first depth D1; a shallow doped region of the second conductivity type, the shallow doped region being in the semiconductor layer and extending from the surface to a shallow doped depth dl; a second doped region of the first conductivity type, the second doped region being adjacent to the shallow doped region and at least partially located in the first doped region; and a third doped region of the second conductivity type, the third doped region being adjacent to the second doped region and at least partially overlapping the first doped region.

To achieve the above object, the present invention further provides a method for manufacturing a SiC semiconductor element. The method includes following steps.

In step 1, a semiconductor of a first conductivity type and a first mask on the semiconductor layer are provided. The first mask includes a first opening. The semiconductor layer is made of SiC and includes a surface.

In step 2, a first doped region of a second conductivity type is formed by a first ion implantation on the semiconductor layer. The first doped region is in the semiconductor layer, and includes an upper doping boundary spaced from the surface by a first depth D1.

In step 3, a second mask on the semiconductor layer is provided. The second mask includes a second opening having a width smaller than that of the first opening.

In step 4, a second doped region of the first conductivity type is formed by the second ion implantation, and a shallow doped region of the second conductivity type is formed by a third ion implantation. The shallow doped region is in the semiconductor layer and extends from the surface to a shallow doped depth dl. The second doped region is adjacent to the shallow doped region, and is at least partially located in the first doped region. A tilt angle is formed between an incident direction of the third ion implantation and a normal line of the semiconductor layer.

In step 5, a third mask on the semiconductor is provided. The third mask includes a third opening. A third doped region of the second conductivity type is formed by a fourth ion implantation through the third opening. The third doped region is adjacent to the second doped region, and at least partially overlaps the first doped region.

In step 6, a dielectric layer is formed on the semiconductor layer.

In step 7, a gate electrode layer is formed on the dielectric layer.

In conclusion, compared to the prior art, the present invention achieves following effects. By spacing the first doped region from the surface of the semiconductor layer by the first depth, and disposing the shallow doped region between the first doped region and the surface of the semiconductor layer, the turn-on resistance of a MOS controlled element can be reduced while a predetermined threshold voltage can be maintained. Further, as the surface of the semiconductor layer is not doped with a high concentration, the variation in thickness of gate dielectric layer due to concentration dependent oxidation of SiC can be avoided. Thus, element reliability can be enhanced.

BRIEF DESCRIPTION OF THE DRAWINGS

FIG. 5A to FIG. 5I are schematic diagrams of a process of a manufacturing method according to an embodiment of the present invention;

FIG. 6A to FIG. 6D are schematic diagrams of a process of a manufacturing method according to another embodiment of the present invention; and FIG. 7A to FIG. 7D are schematic diagrams of a process of a manufacturing method according to another embodiment of the present invention.

DETAILED DESCRIPTION OF THE PREFERRED EMBODIMENTS

Details and technical contents of the present invention are given with the accompanying drawings below.

Figure 1:
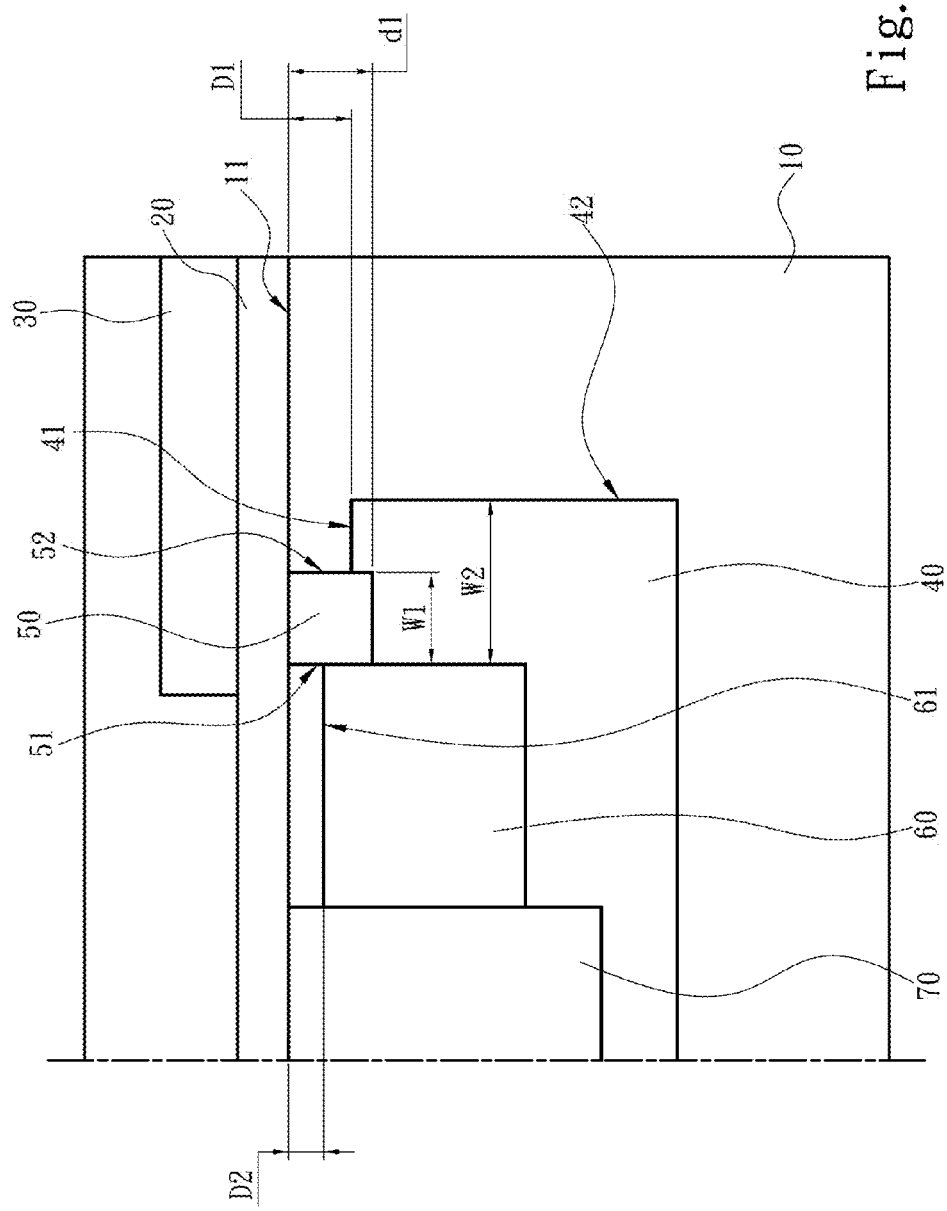
FIG. 1 is a section view before a source electrode is formed according to an embodiment of the present invention.
Figure 2:
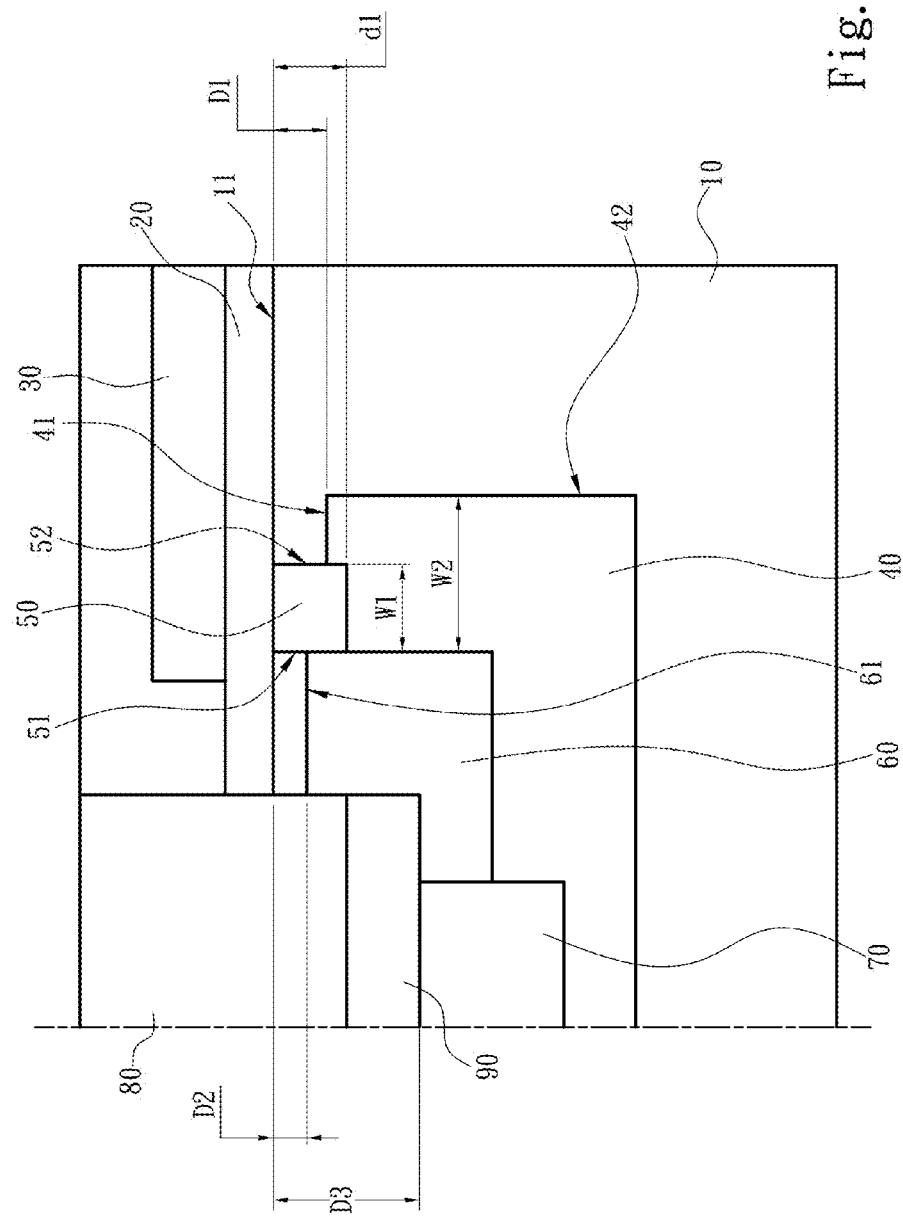
FIG. 2 is a section view after a source electrode is formed according to an embodiment of the present invention.

FIG. 1 and FIG. 2 are a section view before a source electrode is formed and a section view after the source electrode is formed, respectively. As shown, a silicon carbide (SiC) semiconductor element provided by the present invention includes a semiconductor layer 10, a dielectric layer 20, a gate electrode layer 30, a first doped region 40, a shallow doped region 50, a second doped region 60 and a third doped region 70. The semiconductor layer 10 is of a first conductivity type and includes a surface 11. The dielectric layer 20 is on the surface 11 of the semiconductor layer 10. The gate electrode layer 30 is on the dielectric layer 20. In the embodiment, the first conductivity type is n type. In the present invention, the semiconductor layer 10 is made of 4H—SiC, and has a thickness between 1 μm and 35 μm and a doping concentration between $1\times10^{14}$ cm$^{-3}$ and $1\times10^{17}$ cm$^{-3}$. For example, the dielectric layer 20 may be made of silicon dioxide, nitrogen silicon oxide, silicon nitride, aluminum oxide or aluminum nitride. For example, the gate electrode layer 30 may be made of highly doped n-type polysilicon or highly doped p-type polysilicon.

The first doped region 40 is of a second conductivity type, which is opposite the first conductivity type. In the embodiment, the second conductivity type is p type. The first doped region 40 is in the semiconductor layer 10, and includes an upper doping boundary 41 and a first lateral doping boundary 42. Further, the first doped region 40 has a doping concentration greater than 1E17 cm$^{-3}$. In the present invention, the doping boundary refers to a metallurgical junction between p-type and n-type regions. Or when a region and the semiconductor layer 10 have the same conductivity, the doping boundary is defined as 1% of the highest concentration of the region. For example, in the embodiment, the semiconductor layer 10 is n-type, and the first doped region 40 is p-type. The doping boundary of the first doped region 40 is a p-n junction between the first doped region 40 and the semiconductor layer 10. The upper doping boundary 41 is spaced from the surface 11 of the semiconductor layer 10 by a first depth D1. In the embodiment, the first depth D1 is between 1 nm and 1000 nm. In another embodiment, the first depth D1 is preferably between 10 nm and 500 nm. In one embodiment of the present invention, the first depth D1 is 15 nm. The shallow doped region 50 is in the semiconductor layer 10, and extends from the surface 11 of the semiconductor layer 10 to a shallow doped depth dl. The shallow doped region 50 has a doping concentration smaller than $1E20\ cm^{-3}$.

Figure 3:
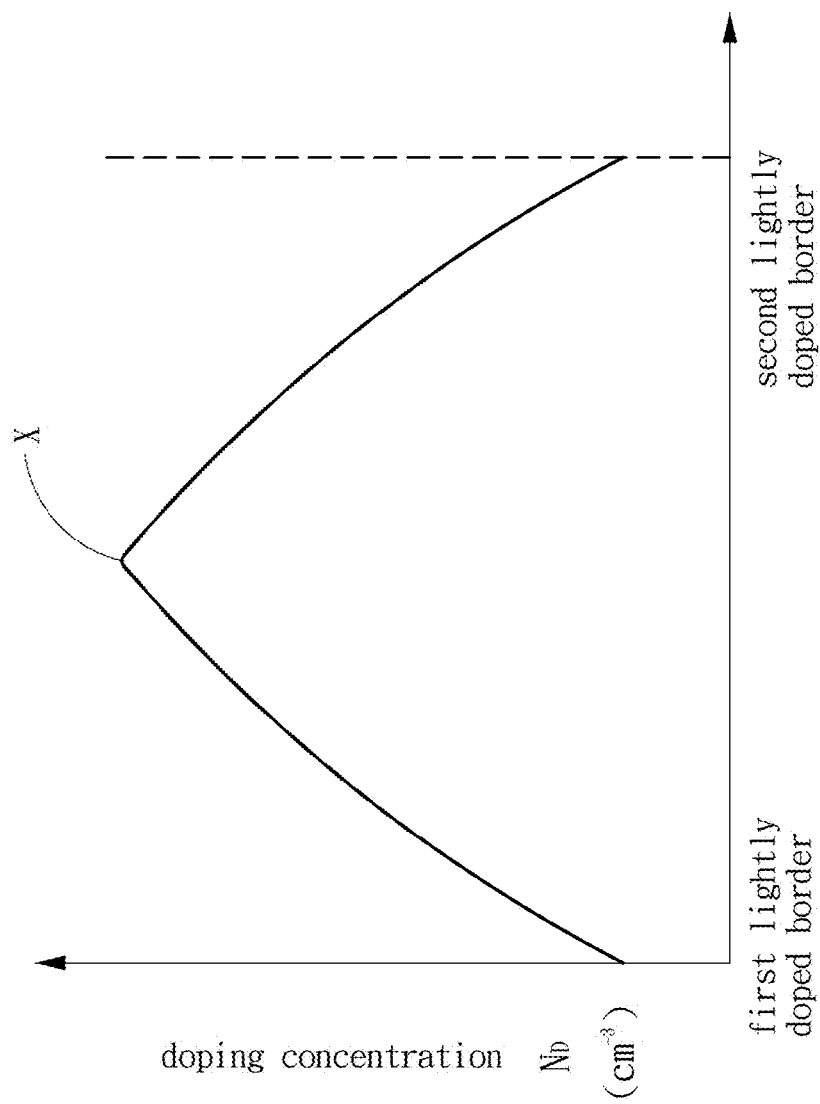
FIG. 3 is a schematic diagram of a doping concentration distribution along a lateral direction of a shallow doped region according to an embodiment of the present invention.

In one embodiment of the present invention, the shallow doped region 50 is of the second conductivity type and has a doping concentration smaller than $1E20\ cm^{-3}$. The doping concentration forms a gradient distribution along a lateral direction. More specifically, the doping concentration increases from the first shallow doping boundary 51, reaches a peak value X between the first shallow doping boundary 51 and the second shallow doping boundary 52, and decreases towards the second shallow doping boundary 52. A distance between a position of the peak value X of the gradient distribution and the first shallow doping boundary 51 is smaller than a distance between the position of the peak value X and the second shallow doping boundary 52. FIG. 3 shows a schematic diagram of a doping concentration distribution along a lateral direction of a shallow doped region according to an embodiment of the present invention. In FIG. 3, the horizontal axis is the position coordinate. In the embodiment, the doping concentration of the semiconductor layer 10 is $6E16\ cm^{-3}$, and so the first shallow doping boundary 51 is located at 0.03 μm of the horizontal axis, and the second shallow doping boundary 52 is located at 0.31 μm of the horizontal axis. The vertical axis is the doping concentration $N_A$ ($cm^{-3}$). In the embodiment, the doping concentration of the peak value X is $1.5E18\ cm^{-3}$. In the present invention, a gradient distribution of the doping concentration formed along a lateral direction refers to a distribution of a lateral region in the shallow doped region 50 parallel to the surface 11 and the doping concentration between the first shallow doping boundary 51 and the second shallow doping boundary 52. Besides, the lateral region having the doping concentration of the peak value X can also be extended so that the peak of FIG. 3 becomes a plateau.

The second doped region 60 is of the first conductivity type, and the third doped region 70 is of the second conductivity type. In the embodiment, the second doped region 60 is n-type, and the third doped region 70 is p-type. The second doped region 60 is adjacent to the shallow doped region 50, and the third doped region 70 is adjacent to the second doped region 60. Further, the second doped region 60 and the third doped region 70 are at least partially in the first doped region 40. The second doped region 60 has a doping concentration greater than $5E18\ cm^{-3}$. In the embodiment, as shown in FIG. 1, for example, the second doped region 60 and the third doped region 70 partially overlap the first doped region 40. In another embodiment, for example, the second doped region 60 may also be entirely in the first doped region 40, and a lower portion of the third doped region 70 may extend to a depth greater than that of the first doped region 40. The surface 11 of the semiconductor layer 10 is spaced from an upper boundary 61 of the second doped region 60 by a second depth D2. For example, in one embodiment, the highest concentration of the second doped region 60 is $1.5E20\ cm^{-3}$, then the upper boundary 61 is the upper contour of $1.5E18\ cm^{-3}$ doping concentration. The second depth D2 is between 1 nm and 1000 nm. In another embodiment, the second depth D2 is preferably between 20 nm and 500 nm. In one embodiment of the present invention, the second depth D2 is 5 nm. Further, the shallow doped region 50 has a first width W1 greater than 0.01 μm, and the first lateral doping boundary 42 is spaced from the second doped region 60 by a second width W2. In one embodiment of the present invention, the second width W2 is greater than the first width W1. For example, W1 is 0.28 μm, and W2 is 0.5 μm.

Referring to FIG. 2, in the embodiment, the SiC semiconductor element further includes a source electrode 80. The source electrode 80 extends from the dielectric layer 20 to the second doped region 60 and the third doped region 70 of the semiconductor layer 10. Further, a lower portion of the source electrode 80 forms a metal silicide layer 90 containing nickel silicide ($Ni_2Si$). The surface 11 of the semiconductor layer 10 is spaced from a bottom of the source electrode 80 by a third depth D3, where D3−D2>1 nm. In the present invention, the SiC semiconductor element may further be selectively arranged into a metal-oxide-semiconductor field-effect transistor (MOSFET) or an insulated gate bipolar transistor (IGBT).

Figure 4A:
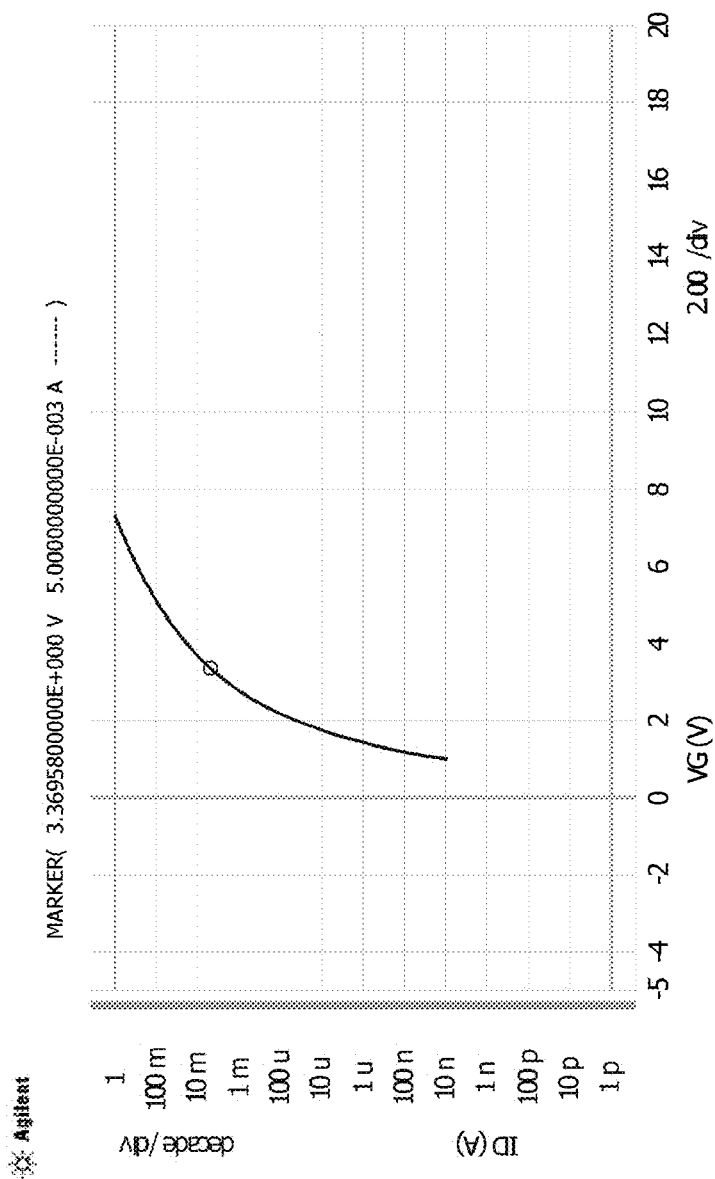
FIG. 4A is a diagram of a transfer characteristic of a metal-oxide-semiconductor field-effect transistor (MOSFET) according to an embodiment of the present invention.
Figure 4B:
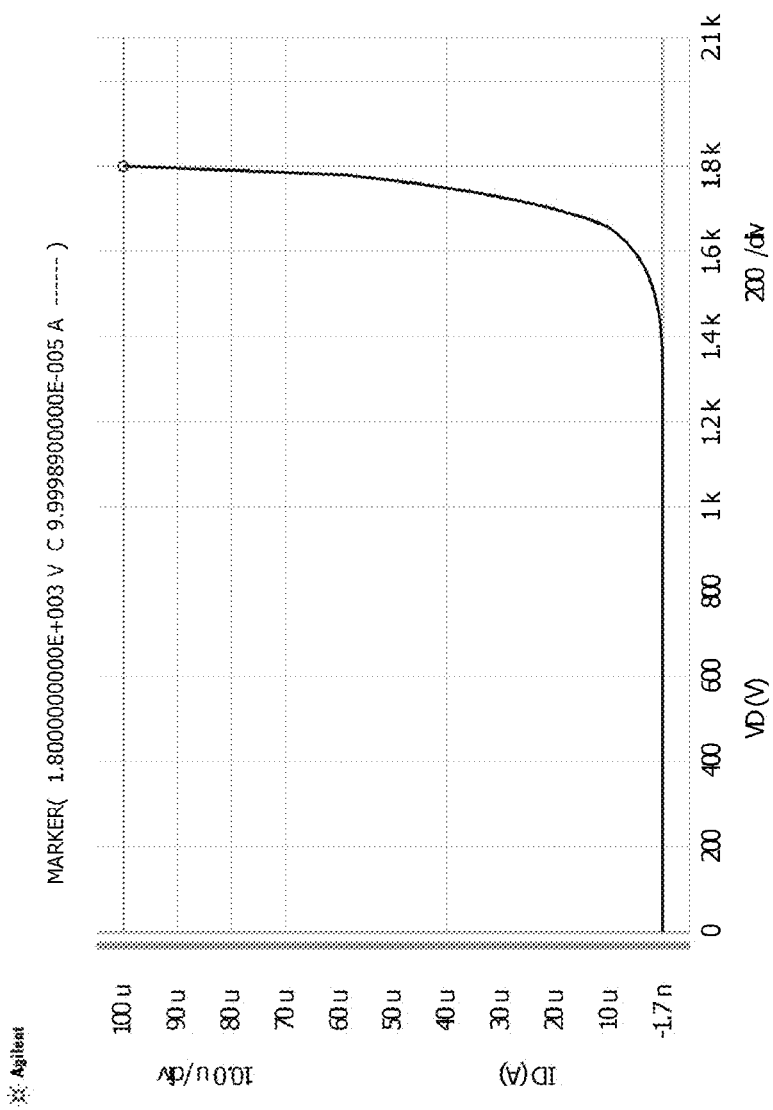
FIG. 4B is a diagram of a blocking characteristic of a MOSFET according to an embodiment of the present invention.

FIG. 4A and FIG. 4B are schematic diagrams of a transfer characteristic and a blocking characteristic of a MOSFET according to an embodiment of the present invention, respectively. FIG. 4A shows a diagram of a characteristic curve ($I_D$-$V_G$) of a drain current ($I_D$, the vertical axis) versus a gate voltage ($V_G$, the horizontal axis) when the drain voltage is 10V. FIG. 4B shows a diagram of a characteristic curve ($I_{DSS}$-$V_{DSS}$) of a drain current ($I_{DSS}$, the vertical axis) versus a drain voltage ($V_{DSS}$, the horizontal axis) at zero gate voltage. In the embodiment, a MOSFET was fabricated with an 11 μm thickness of 4H—SiC semiconductor layer having a doping concentration of $6E15\ cm^{-3}$. Even though the gate oxide layer used for the MOSFET was not the best obtainable one (having a density of interface states ($D_{it}$) of $1E12\ cm^{-2}\ eV^{-1}$), a subthreshold slope less than 200 mV/dec was achieved, which is smaller than the subthreshold slope than a common SiC MOSFET 200 to 300 mV/dec can achieve, as referred to a reviewing paper by Tsunenobu Kimoto, "Material science and element physics in SiC technology for high-voltage power elements", Japanese Journal of Applied Physics 54, 040103 (2015). And a specific resistance of the MOSFET is smaller than $10\Omega\cdot cm^2$. Further, the threshold voltage (defined as the gate voltage when drain current density reaches $0.8\ A/cm^2$ at 10V of drain voltage) was above 3V, and zero gate voltage blocking voltage was 1800V (defined at $I_{DSS}$ of 100 μA).

The present invention further discloses a method for manufacturing a SiC semiconductor element. Referring to FIG. 5A to FIG. 5E showing schematic diagrams of process of a manufacturing method according to an embodiment of present invention, the manufacturing method includes following steps.

In step 1, as shown in FIG. 5A, a semiconductor layer 10 of a first conductivity type and including a surface 11 and a first mask M1 on the semiconductor layer 10 are provided. The first mask M1 includes a first opening H1. In the embodiment, the first mask M1 is a hardmask. For example, a silicon dioxide ($SiO_2$) thin film is deposited, then a photo-resist is coated, exposed and developed with a reticle, and an unwanted portion of $SiO_2$ is removed by etching with the developed pattern of photo-resist to form the first mask M1. The above is an example, and $SiO_2$ may be replaced by other materials.

In step 2, as shown in FIG. 5A, a first ion implantation is performed on the semiconductor layer 10 through the first mask M1 to form a first doped region 40 of a second conductivity type. The first doped region 40 is in the semiconductor layer 10, and includes an upper doping boundary 41 spaced from the surface 11 by a first depth D1. In the embodiment, a dopant used for the first ion implantation may be aluminum or boron. In one embodiment, the dopant is aluminum. Structure details of the first doped region 40 may be referred from FIG. 1 and the associated description.

In step 3, as shown in FIG. 5A, a second mask M2 on the semiconductor layer 10 is provided. The second mask M2 includes a second opening H2 having a width smaller than that of the first opening H1. In the embodiment, the first mask M1 is first removed, and the second mask M2 is then placed on the semiconductor layer 10. In the embodiment, the second mask M2 is also manufactured with a reticle. The first mask M1 and the second mask M2 are manufactured with different reticles, and are both manufactured through lithographic and etching processes. In this step, the first mask M1 is first removed, and the second mask M2 is then provided.

Figure 5B:
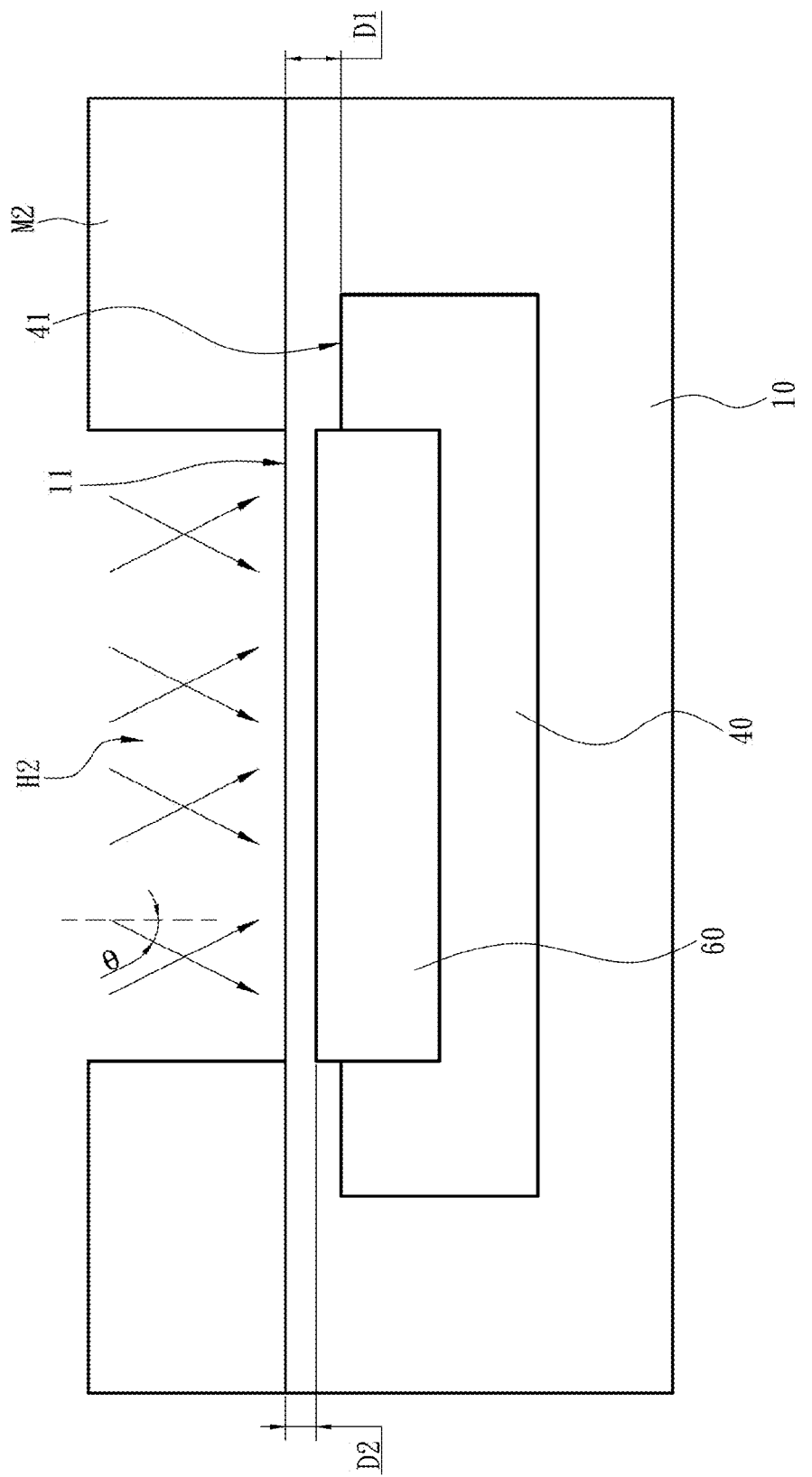
Figure 5C:
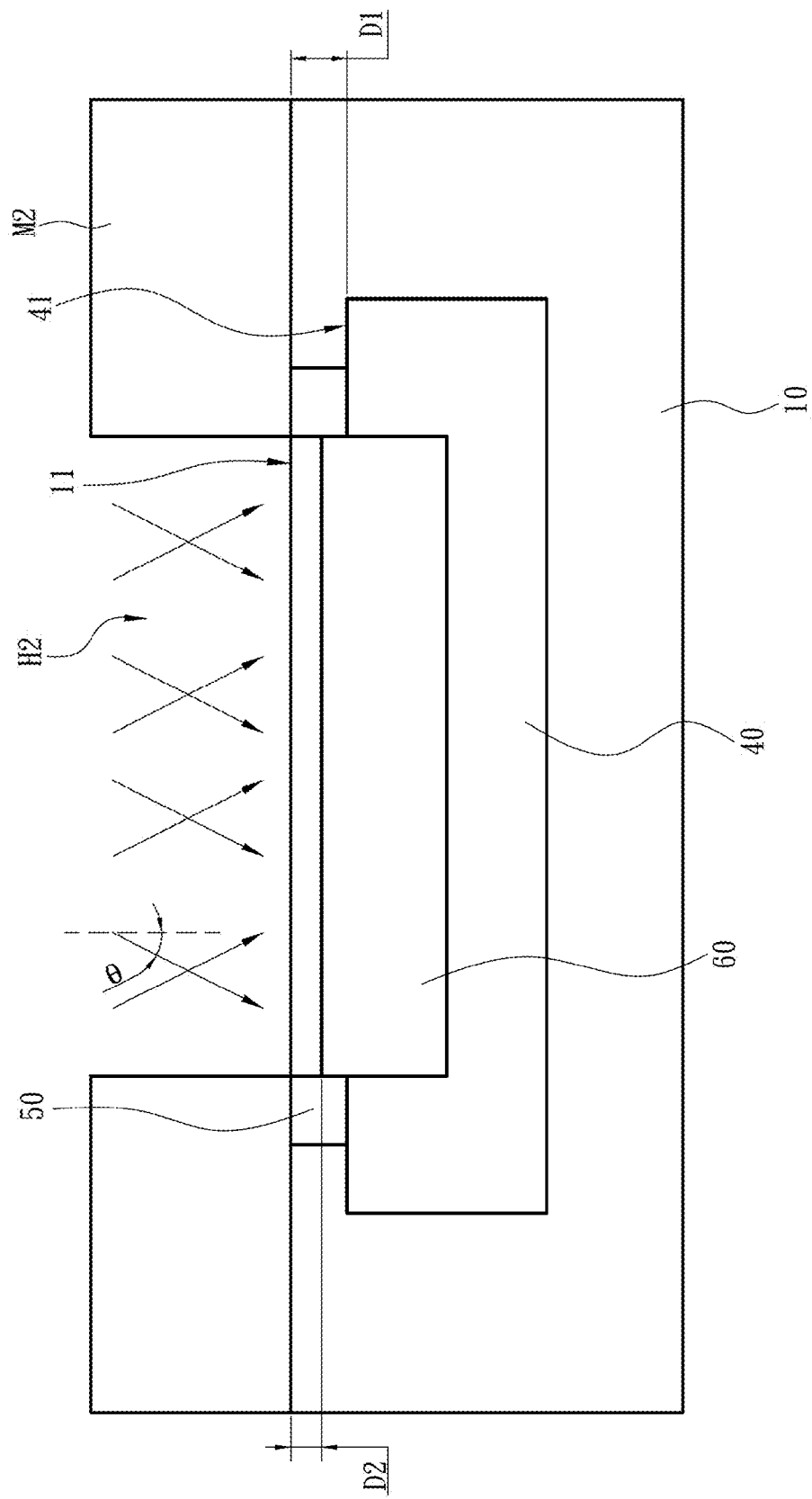

In step 4, referring to FIG. 5B, a second ion implantation is performed through the second mask M2 to form a second doped region 60 of the first conductivity type. As shown in FIG. 5C, a third ion implantation is performed to form a shallow doped region 50 of the second conductivity type.

Figure 5D:
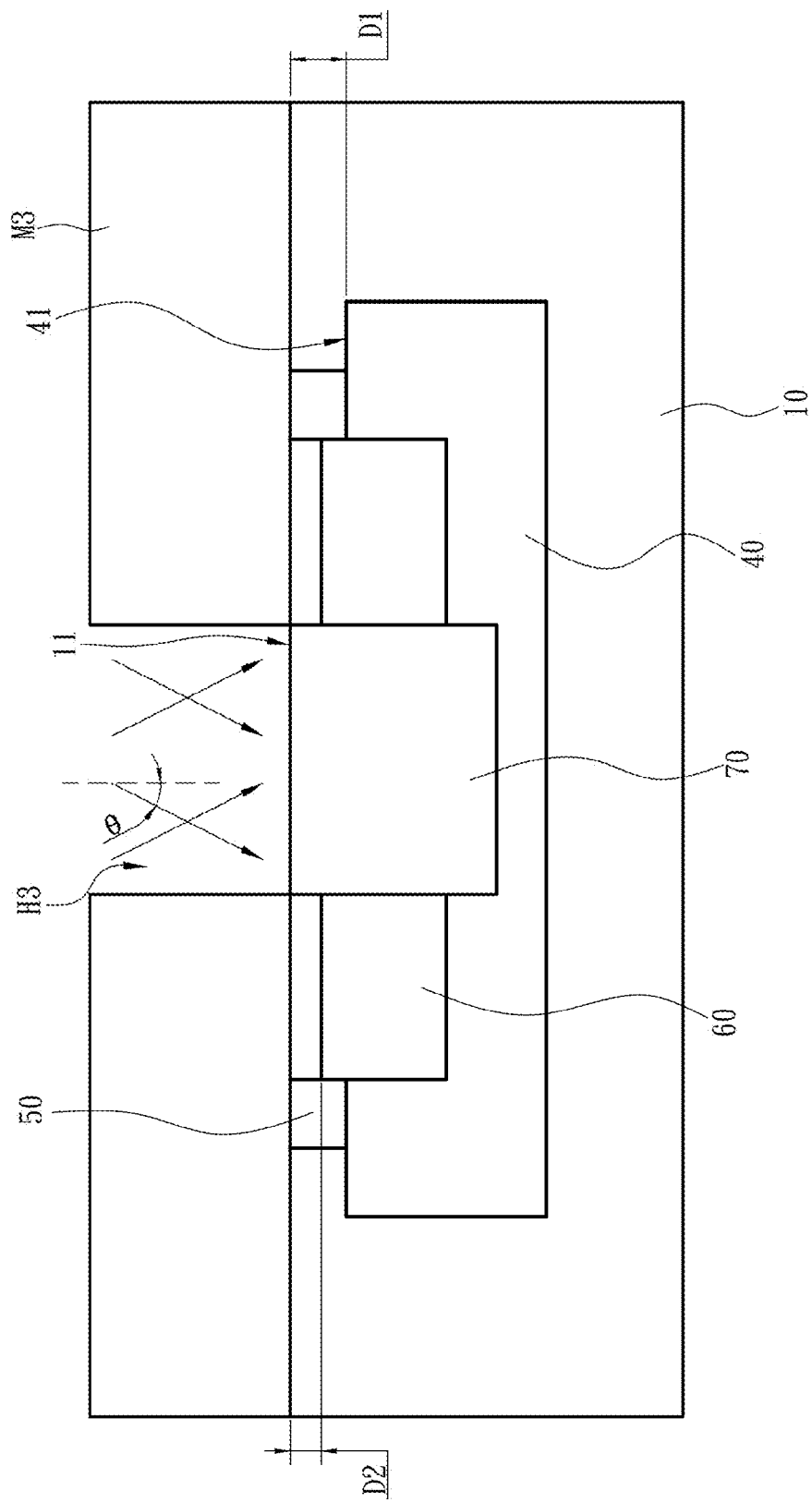

In step 5, as shown in FIG. 5D, a third mask M3 on the semiconductor layer 10 is provided. The third mask M3 includes a third opening H3. A fourth ion implantation is performed on the first doped region 40 to form a third doped region 70 of the second conductivity type. Structure details of the shallow doped region 50, the second doped region 60 and the third doped region 70 can be referred from FIG. 1 and the associated description.

In the embodiment, a dopant of the first ion implantation may be aluminum or boron, and is aluminum in one embodiment. In the embodiment, a dopant of the second ion implantation may be phosphorus or nitrogen, and is phosphorus in one embodiment, a dopant of the third ion implantation may be aluminum or boron, and is aluminum in one embodiment, a dopant of the fourth ion implantation may be aluminum or boron, and is aluminum in one embodiment. As shown in FIG. 1 and FIG. 2, the shallow doped region 50 is in the semiconductor layer 10, and extends from the surface 11 of the semiconductor layer 10 to a shallow doped depth dl. The shallow doped region 50 has a doping concentration smaller than $1E20$ $cm^{-3}$. The doping boundary of the second doped region 60 is the second depth D2, the second doped region 60 is adjacent to the shallow doped region 50 and is at least partially located in the first doped region 40. The third doped region 70 is adjacent to the second doped region 60 and at least partially overlaps the first doped region 40.

A tilt angle θ is formed between an incident direction of the ion implantations and a normal line of the semiconductor layer 10. The tilt angle θ is between 0 degree and 60 degrees. The respective tilt angles θ of the ion implantations may be equal or different. In one embodiment, the tilt angles of the first ion implantation, the second ion implantation and the fourth ion implantation are 0 degree, and the tilt angle θ of the third ion implantation is 30 degree. It should be noted that, FIG. 5B to FIG. 5D are for illustration purposes only. When performing ion implantations, the incident direction of ion beams are fixed, and the semiconductor layer 10 is tilted relative to the incident direction of ion beams according to the required tilt angle θ to form the first doped region 40, the shallow doped region 50, the second doped region 60 and the third doped region 70. The "tilt angle θ" is calculated according to settings of tilt angle of the semiconductor layer 10 in an ion implanter. Thus, in practice, errors may occur in the tilt angle θ due to manufacturing or machine precisions, and such shall not be construed as limitations to the scoped of the present invention.

Figure 5E:
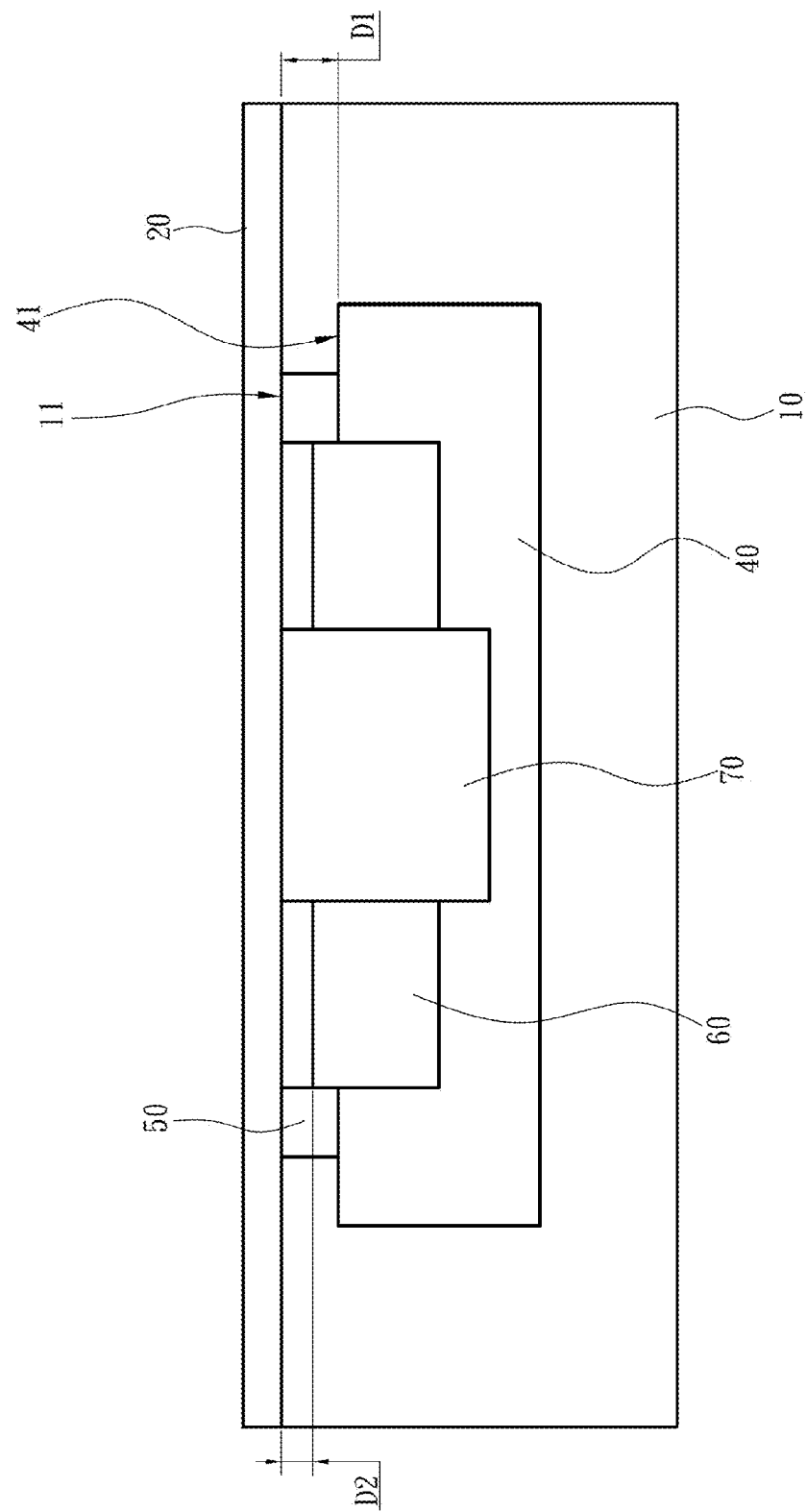

In step 6, as shown in FIG. 5E, a dielectric layer 20 is formed on the semiconductor layer 10. For example, silicon dioxide, silicon oxynitride, silicon nitride, aluminum oxide or aluminum nitride layer formed by a thermal process or a deposition method including thermal oxidation, chemical vapor deposition (CVD) or atomic layer deposition (ALD,) may be used, and an annealing process in a gaseous environment containing nitrous oxide ($N_2O$), nitric oxide (NO), nitrogen ($N_2$), argon (Ar), ammonia ($NH_3$), hydrogen ($H_2$), water ($H_2O$), hydrogen phosphide ($PH_3$) or phosphoryl chloride ($POCl_3$) is selected and performed to form the dielectric layer 20.

Figure 5F:
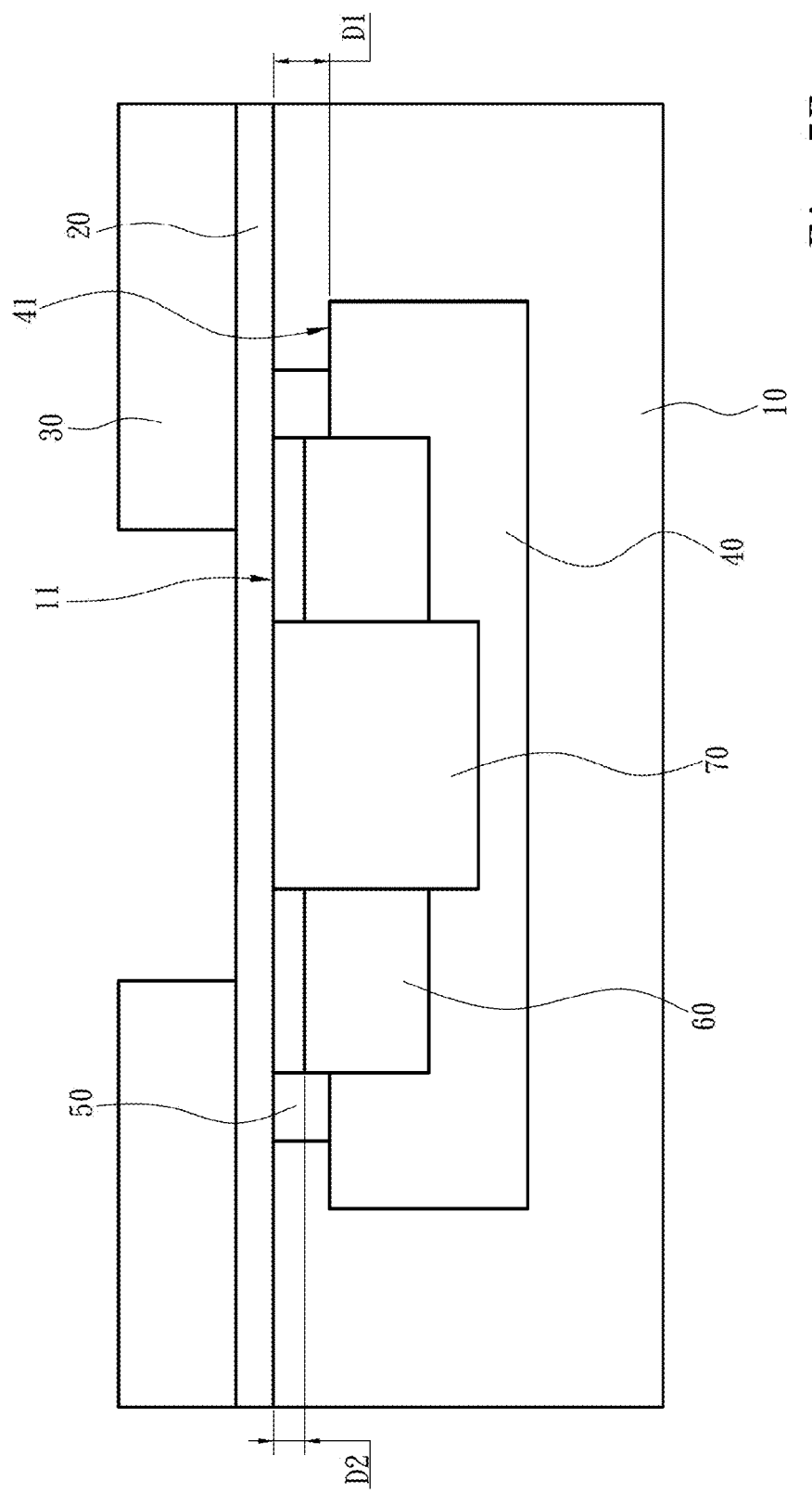

In step 7, as shown in FIG. 5F, a gate electrode layer 30 is formed on the dielectric layer 20. In one embodiment of the present invention, step 7 further includes steps 7A to 7C below.

In step 7A, a gate electrode material is deposited. For example, the gate electrode material is n-type polysilicon with a high doping concentration or p-type polysilicon with a high doping concentration.

In step 7B, a lithography process is performed on the gate electrode material.

In step 7C, the gate electrode material is again caused to partially oxide to form the gate electrode layer 30.

Figure 5H:
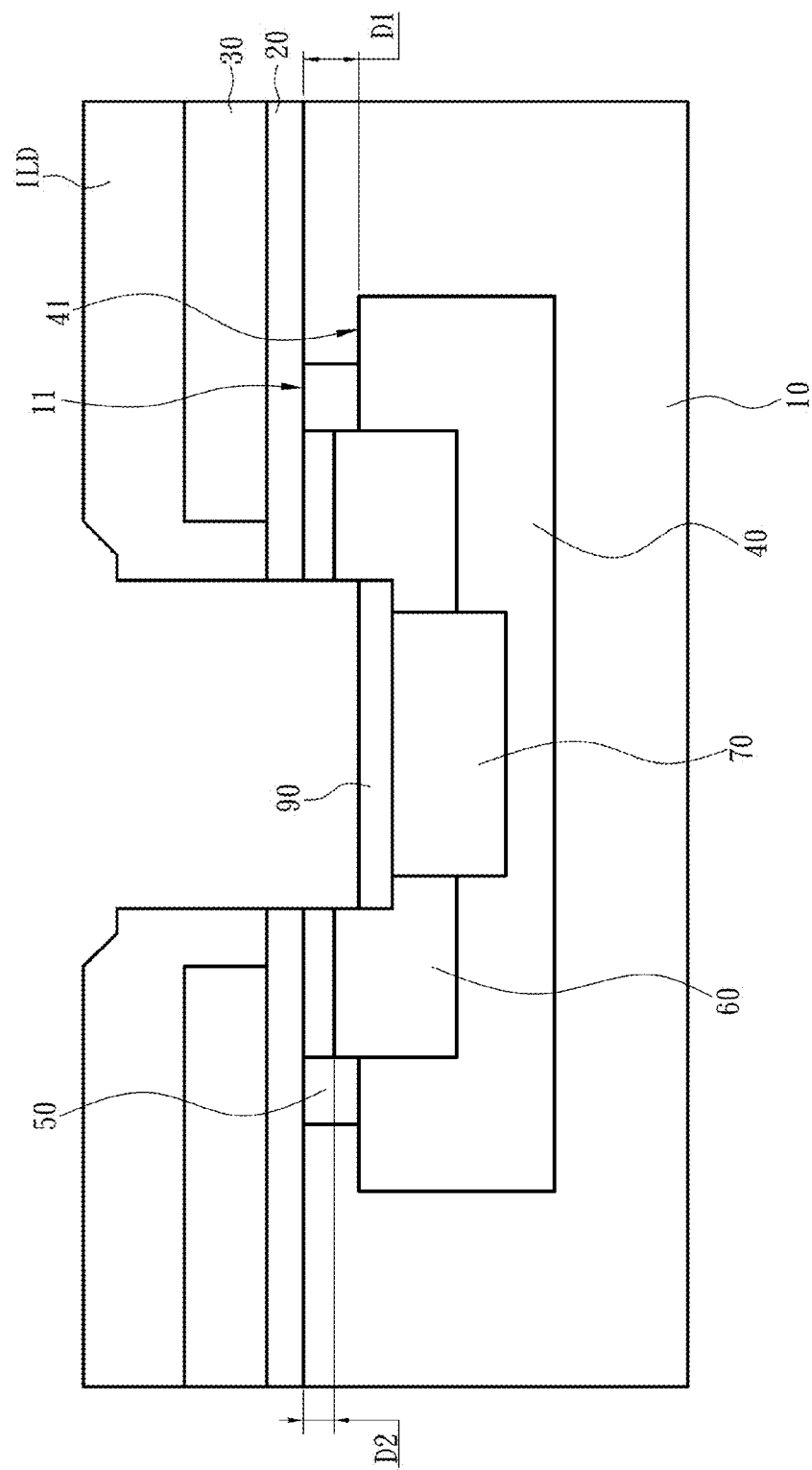
Figure 5I:
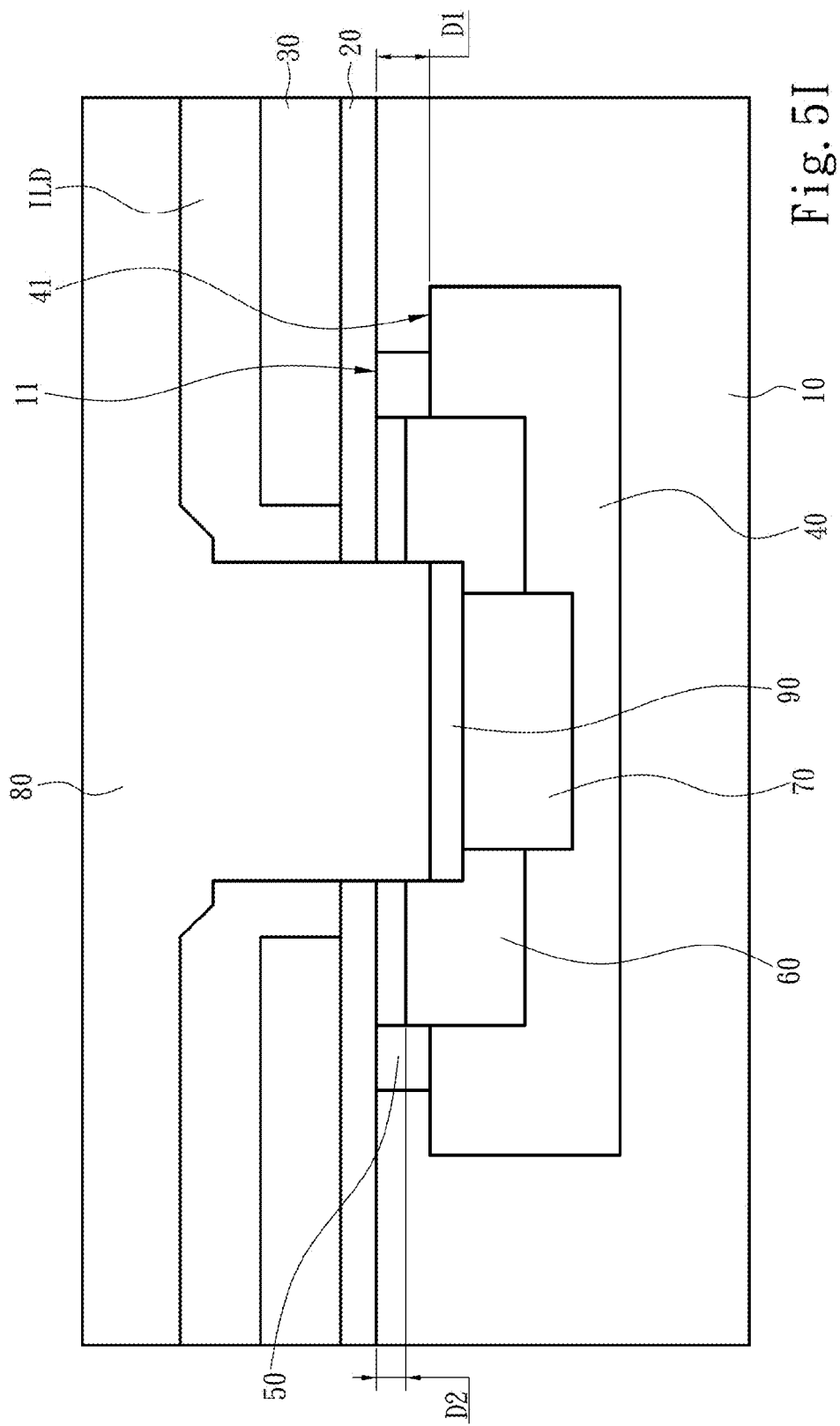

Referring to FIG. 5G to 5I, the manufacturing method according to another embodiment of the present invention further includes following steps.

In step 8, as shown in FIG. 5G an interlayer dielectric layer (ILD) is formed on the gate electrode layer 30.

In step 9, a source contact opening is formed. The source contact opening penetrates the interlayer dielectric layer ILD, the dielectric layer 20 and a part of the semiconductor layer 10, to an extent that a part of the second doped region 60 and the third doped region 70 are revealed.

In step 10, as shown in FIG. 5H, a metal layer comprising nickel is deposited in the source contact opening, and an annealing process at a temperature higher than 900° C. is performed, such that the metal layer reacted with the SiC of the semiconductor layer to form a metal silicide layer 90 containing nickel silicide ($Ni_2Si$). Further, the unreacted metal layer is removed.

In step 11, as shown in FIG. 5I, a source electrode 80 is formed at the source contact opening.

Figure 6A:
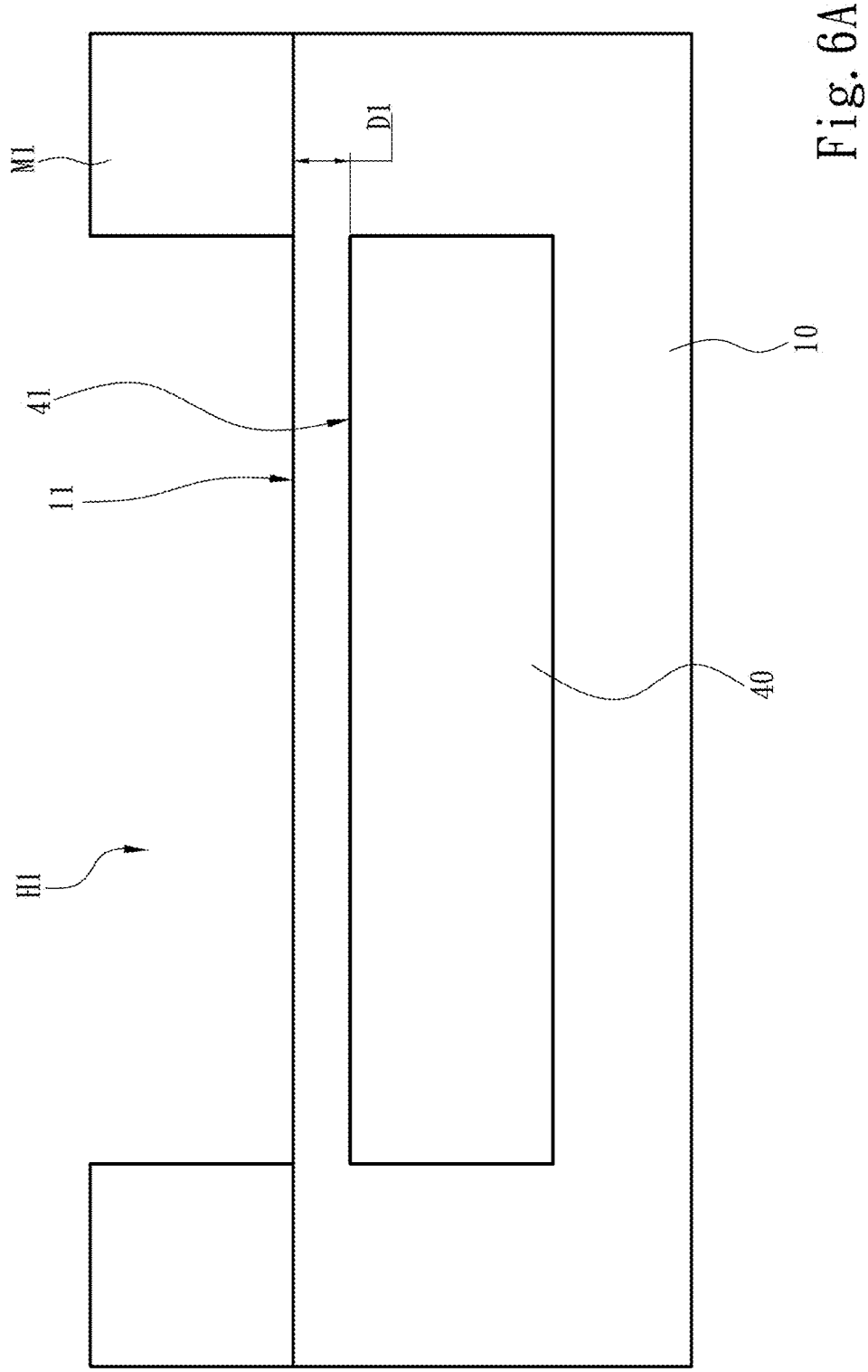
Figure 6C:
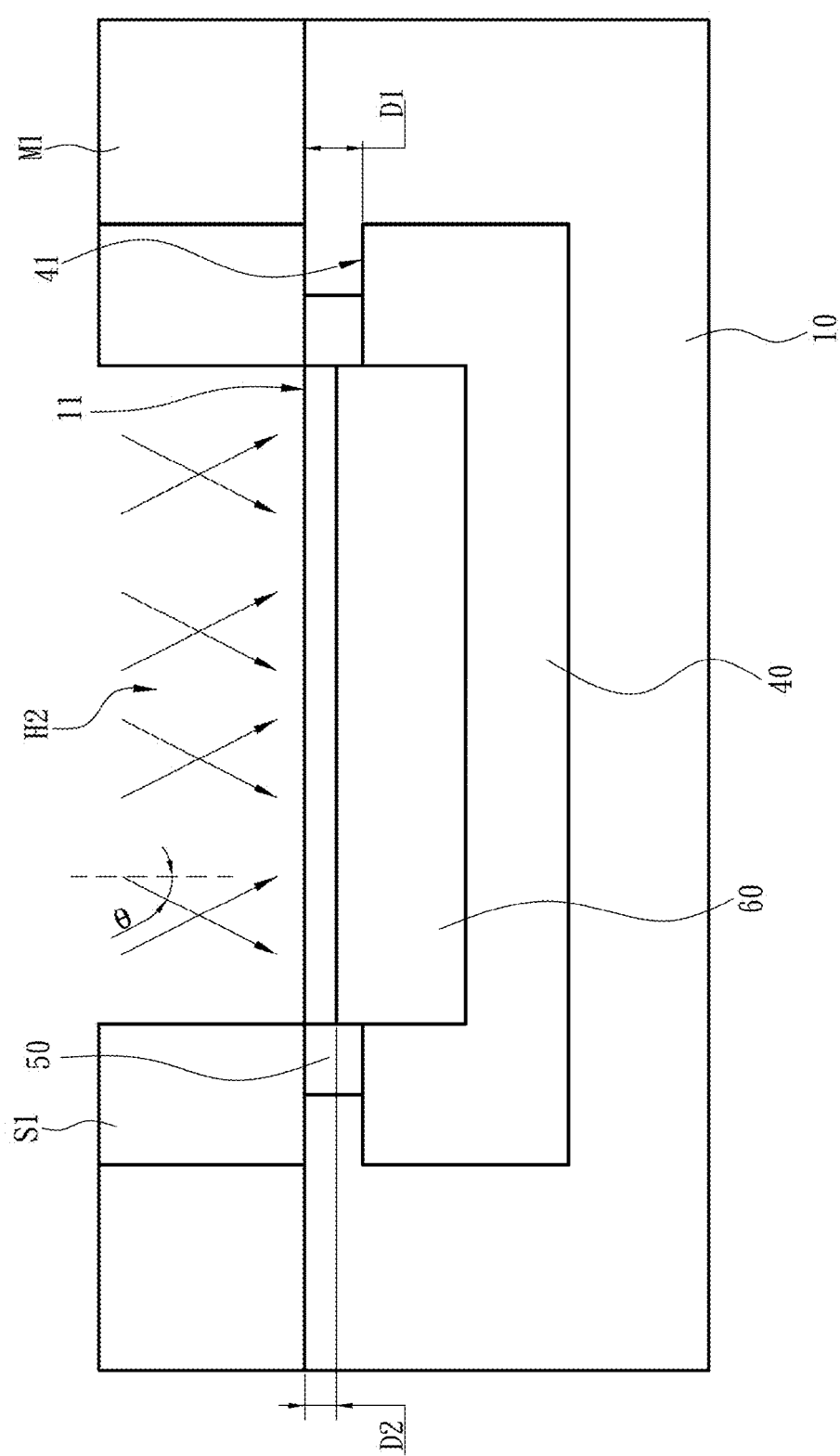

FIG. 6A to FIG. 6D show schematic diagrams of a process of a manufacturing method according to another embodiment of the present invention. One difference of the embodiment from the foregoing embodiment of FIG. 5A to FIG. 5D is that, in step 3, as shown in FIG. 6B and FIG. 6C, the first mask M1 is not removed, and a sidewall spacer S1 is formed on the first mask M1 to form the second mask M2. The sidewall spacer S1 is formed at an inner side of the first mask M1, such that the second mask M2 is self-alignedly formed at the inner side of the first mask M1. In one embodiment, the sidewall spacer S1 is formed by depositing a dielectric layer. In another embodiment, the sidewall spacer S1 is formed by depositing a dielectric layer and then performing an etching back process on the dielectric layer.

Figure 7A:
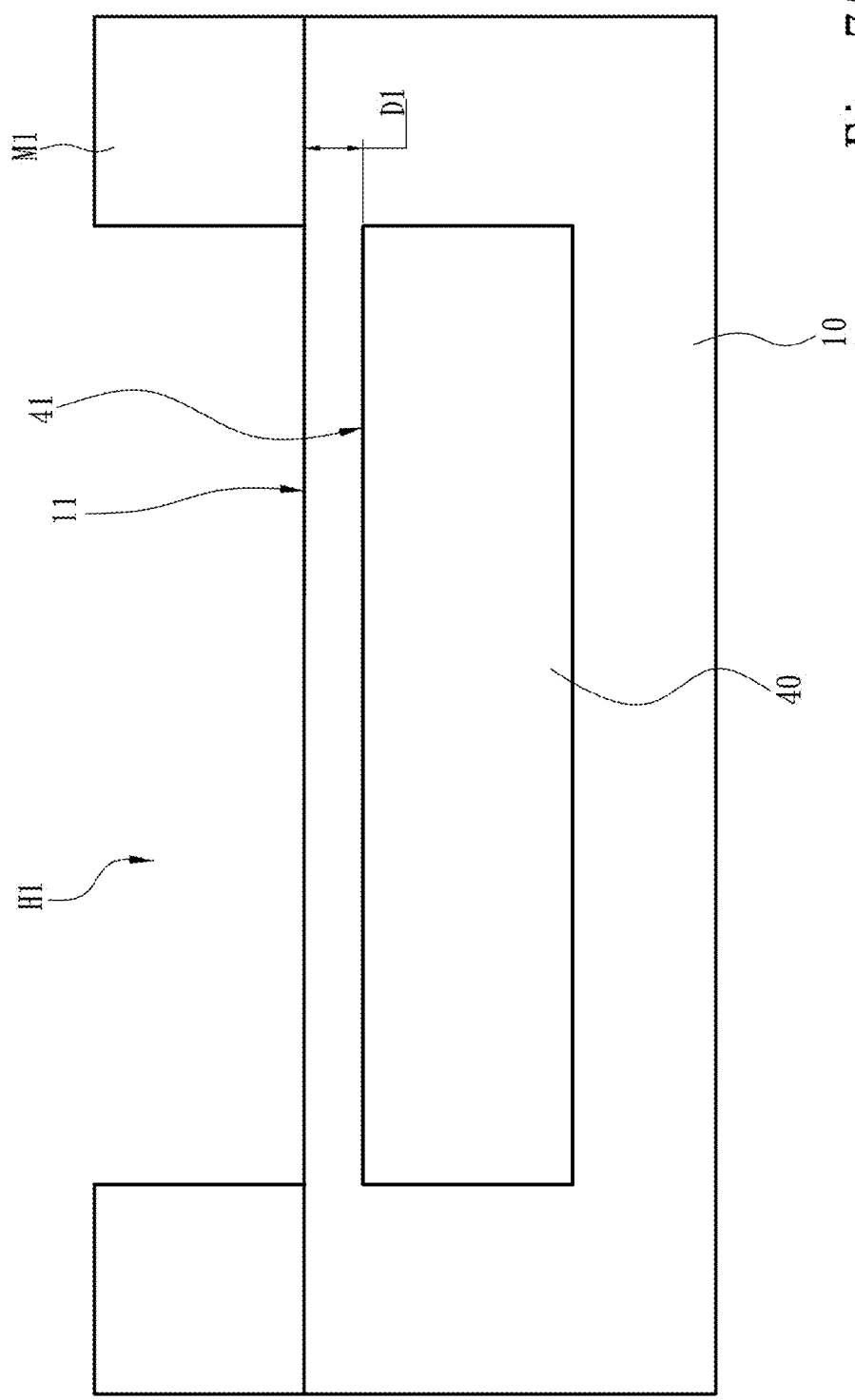
Figure 7C:
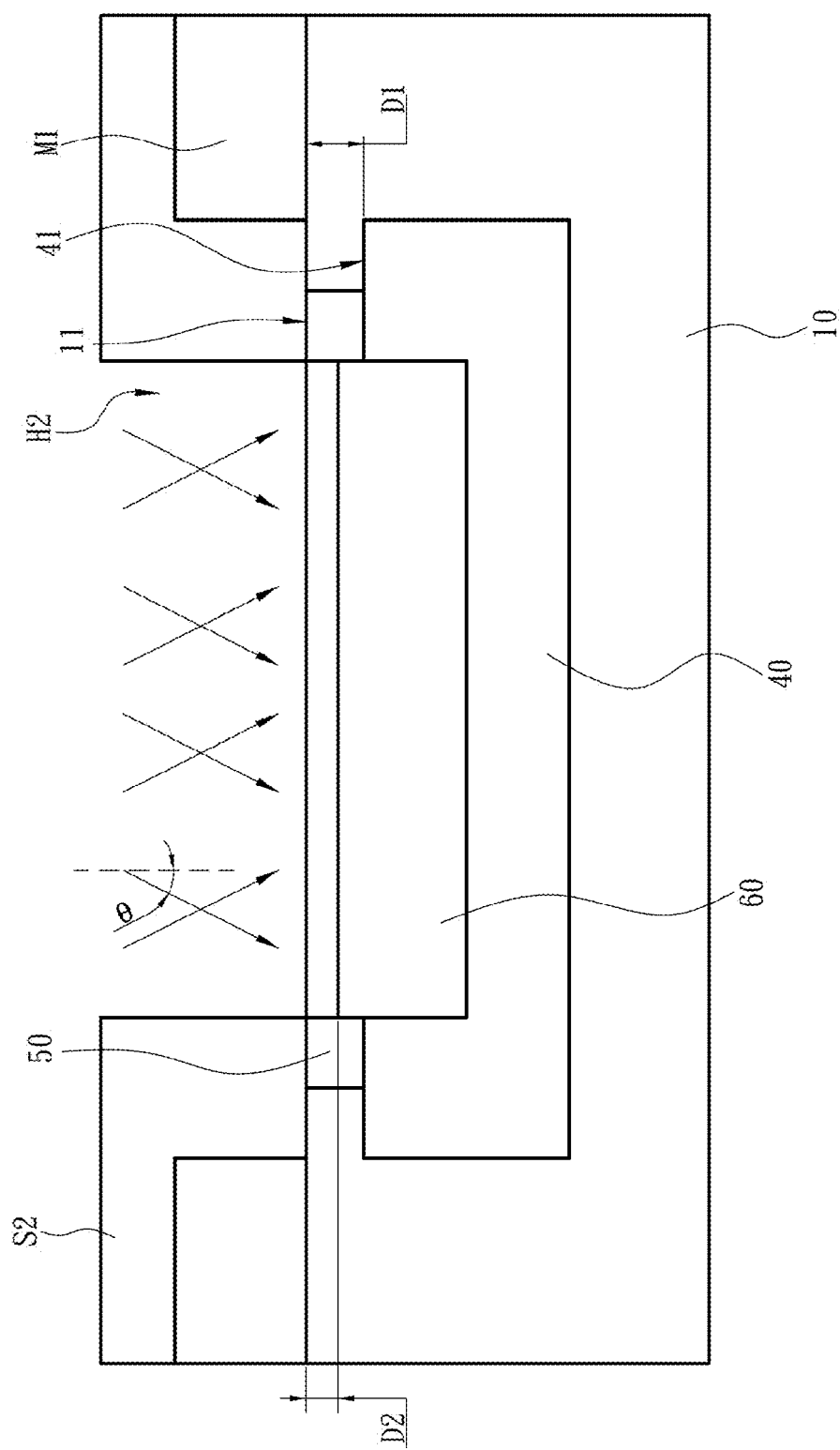
Figure 7D:
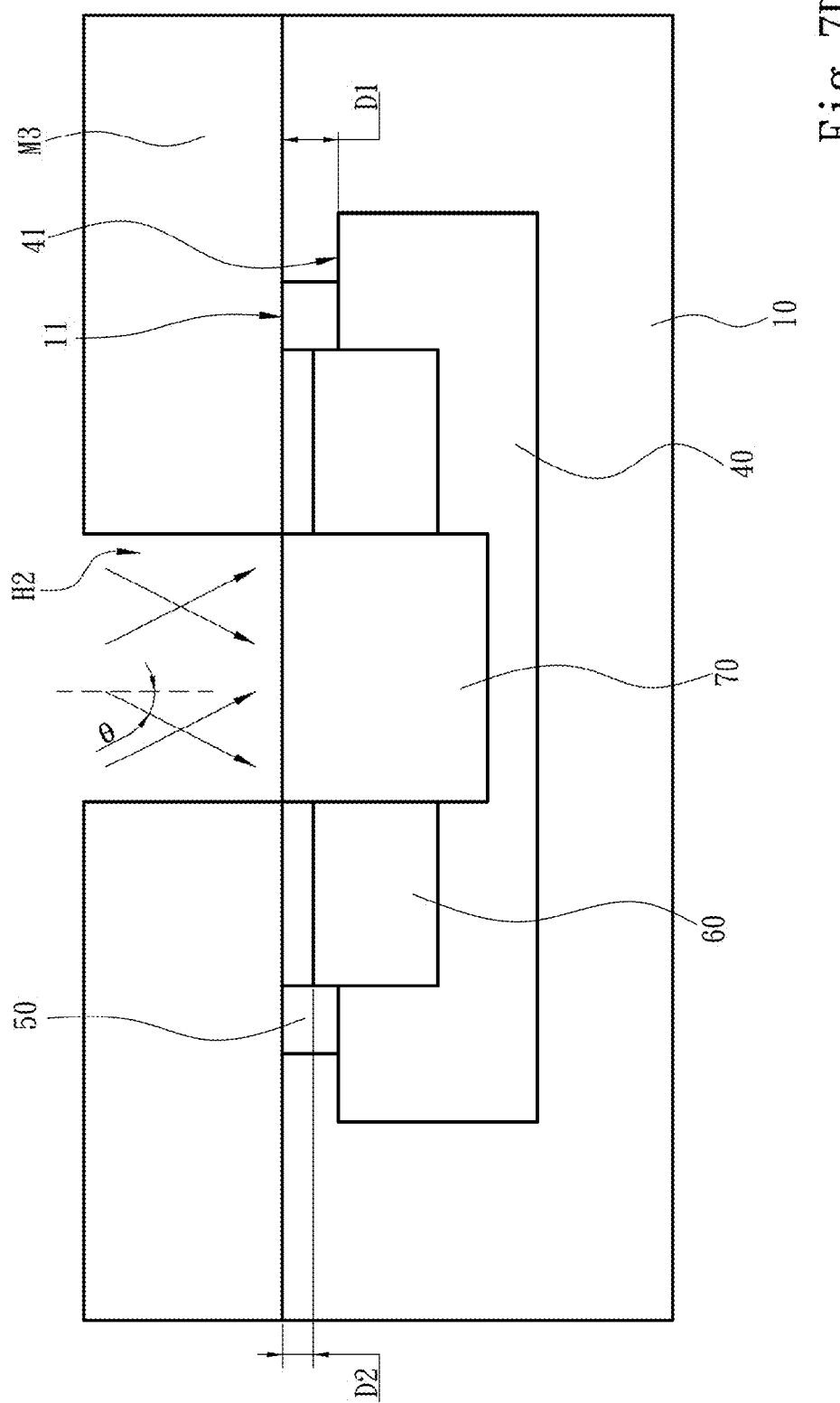

FIG. 7A to FIG. 7D show schematic diagrams of a process of a manufacturing method according to another embodiment of the present invention. One difference of the embodiment from the foregoing embodiment of FIG. 5A to FIG. 5D is that, the first mask M1 is made of polysilicon and is manufactured by using a reticle. In step 3, as shown in FIG. 7B and FIG. 7C, the first mask M1 made of the polysilicon is oxidized by an oxidation process, such that a spacing layer S2 is formed such that a lateral width of the first mask M1 is increased to the second mask M2.

In the embodiment, the mask is for screening the ions when the ion implantations are performed. That is to say, the ions can only be implanted into the semiconductor layer 10 through the openings of the masks. On the other hand, the reticle is used for defining the mask (or the hardmask), and is generally a patterned opaque chromium layer on a transparent quartz substrate. More specifically, in the present invention, the ion implantations used for silicon carbide is usually performed at a temperature of several hundreds degrees Celsius. Thus, a thermally endurable $SiO_2$ film needs to be first deposited, and then lithographic and etching processes are used to transfer a reticle pattern to the $SiO_2$ film to form the hardmask for ion implantations.

In conclusion, in the present invention, the first doped region is spaced from the semiconductor layer by the first depth, and the shallow doped region is disposed between the first doped region and the semiconductor layer. Thus, the turn-on resistance of a MOS controlled element can be reduced while a predetermined threshold voltage can be maintained. Further, as the surface of the semiconductor layer is not doped with a high concentration, the variation in thickness of gate dielectric layer due to concentration dependent oxidation of SiC can be avoided. Thus, element reliability can be enhanced.

What is claimed is:

1. A silicon carbide (SiC) semiconductor element, comprising:
   a semiconductor layer of a first conductivity type, the semiconductor layer made of SiC and comprising a surface;
   a dielectric layer on the semiconductor layer;
   a gate electrode layer on the dielectric layer;
   a first doped region of a second conductivity type opposite the first conductivity type, the first doped region being in the semiconductor layer and comprising a first doping boundary where facing the surface of the semiconductor layer, wherein the first doping boundary is not overlapped with the surface and is spaced from the surface of the semiconductor layer by a first depth D1;
   a shallow doped region of the second conductivity type, the shallow doped region being in the semiconductor layer and extending from the surface to a shallow doped depth dl;
   a second doped region of the first conductivity type, the second doped region being adjacent to the shallow doped region and at least partially located in the first doped region, the second doped region comprising a second doping boundary where facing the surface of the semiconductor layer, wherein the second doping boundary is not overlapped with the surface and is spaced from the surface of the semiconductor layer by a second depth D2; and
   a third doped region of the second conductivity type, the third doped region being adjacent to the second doped region and at least partially overlapping the first doped region.

2. The SiC semiconductor element of claim 1, wherein the shallow doped region has a doping concentration smaller than $1E20$ $cm^{-3}$ and a first width W1 greater than 0.01 µm.

3. The SiC semiconductor element of claim 2, wherein the first doped region further comprises a first lateral doping boundary, and the first lateral doping boundary is spaced from the second doped region by a second width W2 greater than the first width W1.

4. The SiC semiconductor element of claim 1, wherein the first depth D1 is between 1 nm and 1000 nm.

5. The SiC semiconductor element of claim 4, wherein the first depth D1 is between 10 nm and 500 nm.

6. The SiC semiconductor element of claim 1, wherein the second depth is D2 between 10 nm and 1000 nm.

7. The SiC semiconductor element of claim 6, wherein the second depth D2 is between 20 nm and 500 nm.

8. The SiC semiconductor element of claim 6, further comprising a source electrode extending from the dielectric layer to the second doped region and the third doped region of the semiconductor layer.

9. The SiC semiconductor element of claim 8, wherein a lower portion of the source electrode forms a metal silicide layer containing nickel silicide ($Ni_2Si$).

10. The SiC semiconductor element of claim 8, wherein the surface of the semiconductor layer is spaced from a bottom of the source electrode by a third depth D3, where D3-D2>1 nm.

11. The SiC semiconductor element of claim 1, wherein the first doped region has a doping concentration greater than $5E17$ $cm^{-3}$.

12. The SiC semiconductor element of claim 1, wherein the second doped region has a doping concentration greater than $5E18$ $cm^{-3}$.

13. The SiC semiconductor element of claim 2, wherein the doping concentration of the shallow doped region along a lateral direction comprises a first shallow doping boundary adjacent to the second doped region and a second shallow doping boundary away from the second doped region, the doping concentration foul's a gradient distribution, and a distance between a position of a peak value and the first shallow doping boundary is smaller than a distance between the position of the peak value and the second shallow doping boundary.

14. The SiC semiconductor element of claim 1, configured as a metal-oxide-semiconductor field-effect transistor (MOSFET).

15. The SiC semiconductor element of claim 1, configured as an insulated gate bipolar transistor (IGBT).

* * * * *